(12) United States Patent
Fujii et al.

(10) Patent No.: US 11,398,436 B2
(45) Date of Patent: Jul. 26, 2022

(54) MODULE HAVING SEALING LAYER WITH RECESS

(71) Applicant: Murata Manufacturing Co., Ltd., Kyoto (JP)

(72) Inventors: Akihiro Fujii, Kyoto (JP); Yuta Morimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 273 days.

(21) Appl. No.: 16/601,777

(22) Filed: Oct. 15, 2019

(65) Prior Publication Data
US 2020/0043866 A1 Feb. 6, 2020

Related U.S. Application Data

(63) Continuation of application No. PCT/JP2018/015651, filed on Apr. 16, 2018.

(30) Foreign Application Priority Data

Apr. 19, 2017 (JP) .............................. JP2017-082754

(51) Int. Cl.
*H01L 23/552* (2006.01)
*H01L 23/31* (2006.01)
*H01L 25/065* (2006.01)

(52) U.S. Cl.
CPC ........ *H01L 23/552* (2013.01); *H01L 23/3121* (2013.01); *H01L 25/0652* (2013.01)

(58) Field of Classification Search
CPC . H01L 23/552; H01L 25/0652; H01L 25/042; H01L 25/0655; H01L 25/072;
(Continued)

(56) References Cited

U.S. PATENT DOCUMENTS 11,075,170 B2 * 7/2021 Shin ...................... H01L 23/552
2003/0087538 A1 5/2003 Ueno
(Continued)

FOREIGN PATENT DOCUMENTS

| JP | 2003-142831 A1 | 5/2003 |
| JP | 2011-155223 A | 8/2011 |

(Continued)

OTHER PUBLICATIONS

International Search Report for PCT/JP2018/015651 dated Jul. 3, 2018.
Written Opinion for PCT/JP2018/015651 dated Jul. 3, 2018.

*Primary Examiner* — Selim U Ahmed
*Assistant Examiner* — Evan G Clinton
(74) *Attorney, Agent, or Firm* — Pearne & Gordon LLP

(57) ABSTRACT

The present disclosure enables a component to operate stably by making it unlikely that the component will be affected by unwanted electromagnetic waves generated by another component. A module includes: a substrate; a first component and a second component that are mounted on one main surface of the substrate; a sealing resin layer that seals the first component and the second component; and a shield layer that covers part of the sealing resin layer. A recess is formed in the sealing resin layer toward the one main surface from a surface including an upper surface of the sealing resin layer between the first component and the second component in a plan view from a direction perpendicular to the one main surface. The shield layer is not provided in the recess of the sealing resin layer.

20 Claims, 11 Drawing Sheets

(58) Field of Classification Search
CPC ............... H01L 25/0753; H01L 25/115; H01L 25/065–0657; H01L 25/105; H01L 25/16–167; H01L 25/18
See application file for complete search history.

(56) References Cited

U.S. PATENT DOCUMENTS

| | | |
|---|---|---|
| 2012/0320559 A1 | 12/2012 | Kimura |
| 2016/0095267 A1 | 3/2016 | Kitazaki |
| 2017/0117229 A1* | 4/2017 | Kumbhat ............ H01L 23/3121 |

FOREIGN PATENT DOCUMENTS

| | | |
|---|---|---|
| JP | 2011-187677 A | 9/2011 |
| JP | 2016-072411 A | 5/2016 |

* cited by examiner

PRIOR ART

MODULE HAVING SEALING LAYER WITH RECESS

This is a continuation of International Application No. PCT/JP2018/015651 filed on Apr. 16, 2018 which claims priority from Japanese Patent Application No. 2017-082754 filed on Apr. 19, 2017. The contents of these applications are incorporated herein by reference in their entireties.

BACKGROUND

Technical Field

The present disclosure relates to a module having a structure that suppresses interference between components mounted on a substrate caused by unwanted electromagnetic waves.

In modules in which a plurality of components are mounted on a substrate, a shield part is sometimes provided between components in order to suppress interference between the components caused by unwanted electromagnetic waves. A circuit module 100 disclosed in Patent Document 1 and illustrated in FIG. 13 is an example of such a module in which a shield part is provided between components.

The circuit module 100 includes: a wiring substrate 110; a plurality of electronic components 120 arranged on the wiring substrate 110; a sealing layer 130 that seals the electronic components 120; and an electrically conductive shield 140 that covers the sealing layer 130.

The electrically conductive shield 140 includes a first shield portion 141, a second shield portion 142, and a third shield portion 143. The first shield portion 141 and the second shield portion 142 are formed so as to cover an outer surface of the sealing layer 130 (surface including upper surface and side surface of sealing layer 130) and function as an external shield of the circuit module 100. The third shield portion 143 is provided in a groove 131 in the sealing layer 130 and functions as an internal shield of the circuit module 100.

Patent Document 1: Japanese Unexamined Patent Application Publication No. 2016-72411 (refer to paragraphs 0043 and 0060 and FIG. 2)

BRIEF SUMMARY

However, in the above-described circuit module 100, the third shield portion 143 is provided in the groove 131 in the sealing layer 130, and for example unwanted electromagnetic waves emitted from an electronic component 120 remain inside the circuit module 100 and there is a risk of another electronic component 120 operating unstably due to the effect of the unwanted electromagnetic waves.

The present disclosure provides a module that makes it unlikely for a component to be affected by unwanted electromagnetic waves generated by another component and enables the component to operate stably.

A module of the present disclosure includes: a substrate; a first component and a second component that are mounted on one main surface of the substrate; a sealing resin layer that seals the first component and the second component; and a shield layer that covers part of the sealing resin layer. A recess is formed in the sealing resin layer toward the one main surface from a surface of the sealing resin layer that is on an opposite side from a surface of the sealing resin layer that faces the one main surface between at least the first component and the second component in a plan view from a direction perpendicular to the one main surface. The shield layer is provided on the sealing resin layer other than the recess of the sealing resin layer, that is, the shield layer is not formed inside the recess of the sealing resin layer.

According to this configuration, the shield layer is not provided in the recess provided between the first component and the second component. Therefore, unwanted electromagnetic waves generated by one component out of the first component and the second component effectively exit to outside the module from the recess formed in the sealing resin layer and are unlikely to reach the other component out of the first component and the second component. Thus, the other component is unlikely to be affected by the unwanted electromagnetic waves generated by the one component and can operate stably.

Furthermore, an electrode may be formed on the one main surface, and the recess may reach the one main surface in a region of the sealing resin layer that overlaps the electrode in a plan view from a direction perpendicular to the one main surface. With this configuration, unwanted electromagnetic waves generated by the electrode formed on the one main surface of the substrate readily exit to outside the module from the recess of the sealing resin layer and the first component and the second component are unlikely to be affected by the unwanted electromagnetic waves generated by the electrode formed on the one main surface of the substrate and can operate stably.

The recess may be formed outside the first component so as to pass between the first component and the second component and surround an entire periphery of the first component in a plan view from a direction perpendicular to the one main surface. With this configuration, unwanted electromagnetic waves generated by one component out of the first component and the second component are unlikely to reach the other component out of the first component and the second component and the other component is unlikely to be affected by the unwanted electromagnetic waves generated by the one component and can operate stably.

In addition, the module may further include a shield component that is mounted on the one main surface of the substrate between the first component and the second component inside from a side wall surface of the recess that is on a first component side among side wall surfaces of the recess in a plan view from a direction perpendicular to the one main surface. The shield component may have a conducting portion that extends from a facing surface of the shield component that faces the one main surface to an opposite surface of the shield component that is on an opposite side from the facing surface and the conducting portion may be connected to a ground electrode formed in the substrate on a side close to the facing surface of the shield component. A through hole that reaches the shield component may be formed in the sealing resin layer from a surface of the sealing resin layer that is on an opposite side from a surface of the sealing resin layer that faces the one main surface to the opposite surface of the shield component in at least part of a region that overlaps the shield component in a plan view from a direction perpendicular to the one main surface. The shield layer may be connected to the shield component in the through hole. With this configuration, the shield layer is connected to the ground electrode via the shield component, and therefore unwanted electromagnetic waves generated by the first component are unlikely to leak to the outside. Furthermore, the second component is less likely to be affected by the unwanted electromagnetic waves generated by the first component due to the shield component and the part of the shield layer that covers the through hole and the second component can operate more stably.

In addition, the recess may be formed so as to pass between the first component and the second component from one side surface to another side surface of the sealing resin layer in a plan view from a direction perpendicular to the one main surface. With this configuration, unwanted electromagnetic waves generated by one component out of the first component and the second component are unlikely to reach the other component out of the first component and the second component and the other component is unlikely to be affected by the unwanted electromagnetic waves generated by the one component and can operate stably.

Furthermore, the shield layer may not be provided on one out of a first region and a second region that are formed and divided from each other by the recess, the first region overlapping the first component and the second region overlapping the second component in a plan view from a direction perpendicular to the one main surface. With this configuration, unwanted electromagnetic waves generated by one component out of the first component and the second component can also exit to outside the module from a region where the shield layer is not provided out of the first region and the second region divided by the recess in the surface where the recess is formed and are more unlikely to reach the other component out of the first component and the second component and the other component can operate more stably.

In addition, the shield layer may not be provided on one out of a first side surface portion and a second side surface portion, the first side surface portion surrounding the first component together with the recess and the second side surface portion surrounding the second component together with the recess in a plan view from a direction perpendicular to the one main surface. With this configuration, the unwanted electromagnetic waves generated by one component out of the first component and the second component can also exit to outside the module from the one out of the first side surface portion and the second side surface portion where the shield layer is not provided in the side surface of the sealing resin layer divided by the recess, and the unwanted electromagnetic waves are more unlikely to reach the other component out of the first component and the second component and the other component can operate more stably.

In addition, the recess may be formed so as to pass between the first component and the second component from one side surface of the sealing resin layer toward another side surface of the sealing resin layer up to a position where the recess does not reach the other side surface in a plan view from a direction perpendicular to the one main surface, and the shield layer may not be provided on the one side surface of the sealing resin layer. With this configuration, unwanted electromagnetic waves generated by one component out of the first component and the second component can also exit to outside the module from the one side surface of the sealing resin layer and are more unlikely to reach the other component out of the first component and the second component and the other component can operate more stably.

Furthermore, the module may include a third component that is mounted on another main surface of the substrate, and another sealing resin layer that seals the third component. With this configuration, in the case of a module in which components are mounted on one main surface and another main surface of a substrate as well, unwanted electromagnetic waves generated by one out of a first component and a second component are unlikely to reach the other component out of the first component and the second component and the other component is unlikely to be affected by the unwanted electromagnetic waves generated by the one component and can operate stably.

According to the present disclosure, a recess is formed in a sealing resin layer between at least a first component and a second component in a plan view from a direction perpendicular to one main surface and a shield layer is provided on the sealing resin layer other than the recess of the sealing resin layer, that is, the shield layer is not formed inside the recess of the sealing resin layer. Therefore, unwanted electromagnetic waves generated by one component out of the first component and the second component effectively exit to outside the module from the recess formed in the sealing resin layer and are unlikely to reach the other component out of the first component and the second component. Thus, the other component is unlikely to be affected by the unwanted electromagnetic waves generated by the one component and can operate stably.

DETAILED DESCRIPTION

First Embodiment

Figure 1A:
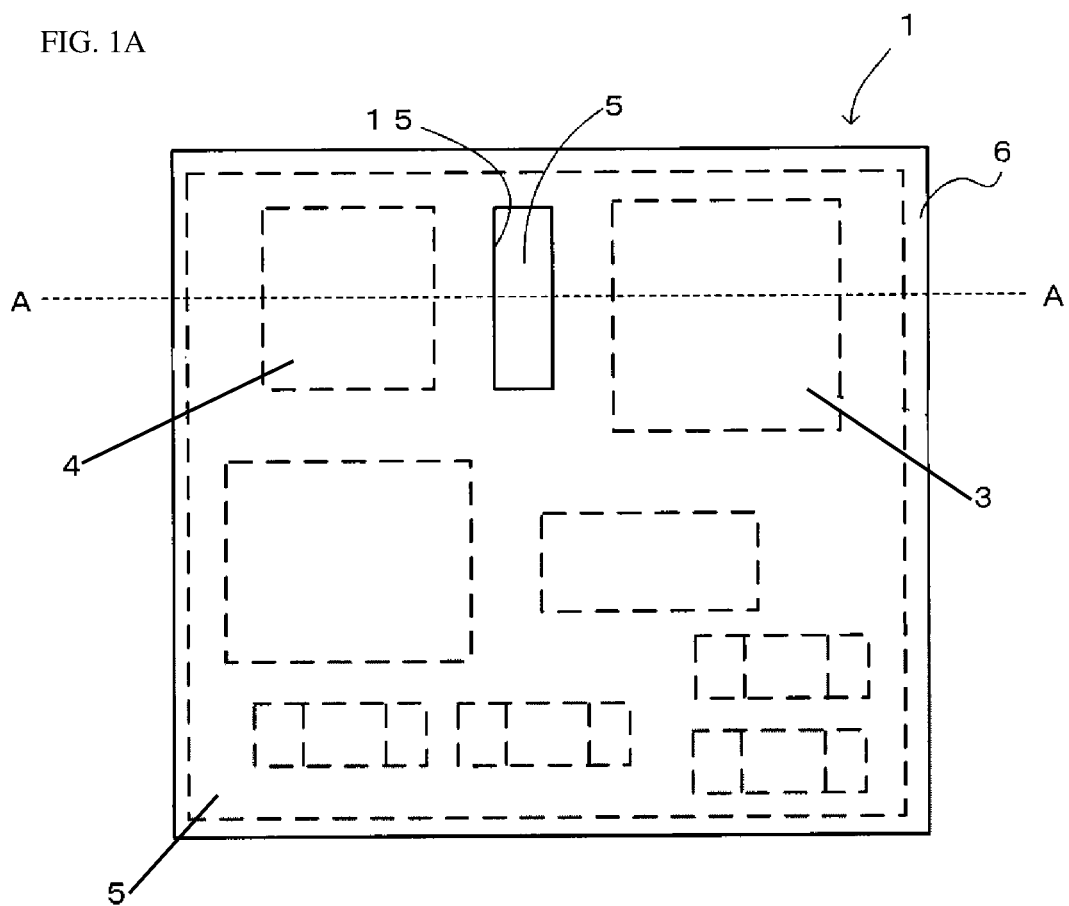
FIG. 1A is a plan view of a module according to a first embodiment of the present disclosure and FIG. 1B is a sectional view taken along line A-A in FIG. 1A.
Figure 1B:
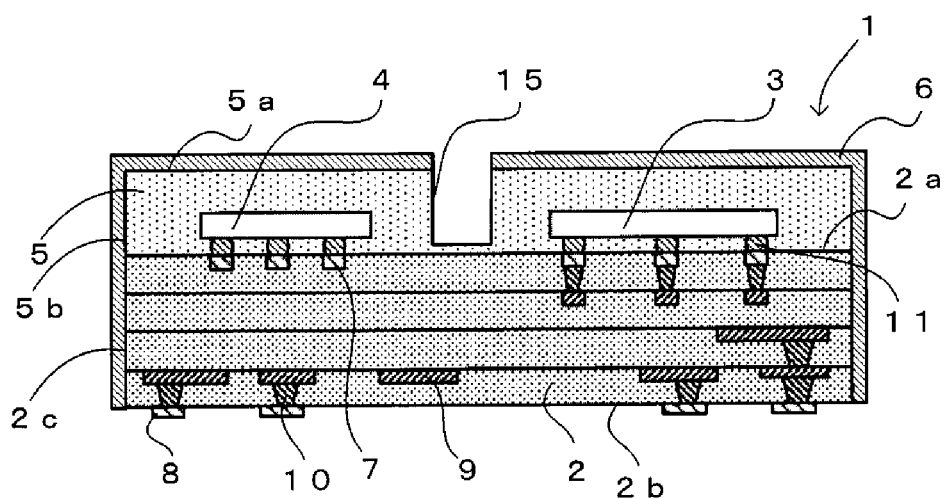

A module 1 according to a first embodiment of the present disclosure will be described while referring to FIGS. 1A and 1B. FIG. 1A is a plan view of the module 1 according to the first embodiment and FIG. 1B is a sectional view taken along line A-A in FIG. 1A.

The module 1 according to the first embodiment is a module that is to be mounted on a mother substrate or the like of an electronic device, for example. The module 1 includes a substrate 2, a plurality of components including a first component 3 and a second component 4 that are mounted on one main surface 2a of the substrate 2, a sealing resin layer 5 that seals various components and so forth including the first component 3 and the second component 4, and a shield layer 6 that covers part of a surface of the sealing resin layer 5 and a side surface 2c of the substrate 2.

The substrate 2 is formed of a low-temperature co-fired ceramic, a glass epoxy resin, or the like. A plurality of land electrodes 7 are formed on the one main surface 2a of the substrate 2, a plurality of outer electrodes 8 are formed on another main surface 2b of the substrate 2, and a plurality of inner electrodes (wiring electrodes, ground electrodes) 9 and via conductors 10 are formed inside the substrate 2. For example, the land electrodes 7 are connected to the inner electrodes (wiring electrodes, ground electrodes) 9 via the via conductors 10 and the outer electrodes 8 are connected to the inner electrodes (wiring electrodes, ground electrodes) 9 via the via conductors 10. The ground electrode is exposed from the side surface 2c of the substrate 2 and contacts the shield layer 6.

Furthermore, the land electrodes 7, the outer electrodes 8, and the inner electrodes (wiring electrodes, ground electrodes) 9 are formed of a metal that is typically used for electrodes such as Cu, Ag, Al, or the like. In addition, the via conductors 10 are formed of a metal such as Ag or Cu.

In the first embodiment, the first component 3 among the plurality of components mounted on the one main surface 2a of the substrate 2 is a component that generates electromagnetic waves, for example, a power amplifier, a switch IC, or an inductor. In addition, the second component 4 among the plurality of components mounted on the one main surface 2a of the substrate 2 is a component that is affected by electromagnetic waves, for example, a switch IC or a baseband IC. The components including the first component 3 and the second component 4 are mounted on the one main surface 2a of the substrate 2 by for example connecting connection terminals thereof to the land electrodes 7 formed on the one main surface 2a of the substrate 2 using solder 11.

The sealing resin layer 5 seals and covers the one main surface 2a and the components including the first component 3 and the second component 4. The sealing resin layer 5 can be formed of a resin that is typically employed as a sealing resin such as an epoxy resin containing a silica filler. In addition, it is also possible to use a resin such as an epoxy resin containing a filler having a high thermal conductivity such as an alumina filler in order to realize high heat conduction.

A recess 15 is formed in the sealing resin layer 5 toward the one main surface 2a from a surface of the sealing resin layer 5 including a surface (hereinafter referred to as an "upper surface") 5a that is farthest from one main surface 2a and on the opposite side from the surface of the sealing resin layer 5 that faces the one main surface 2a between the first component 3 and the second component 4 in a plan view from a direction perpendicular to the one main surface 2a. The depth of the recess 15 from the surface including the upper surface 5a is a depth with which the recess 15 does not reach the one main surface 2a. The depth of the recess 15 is not particularly limited, and may be, for example, a depth with which the recess 15 reaches the one main surface 2a or may be a depth with which the recess 15 reaches a prescribed position between a surface including a circuit mounting surface of the first component 3 or a circuit mounting surface of the second component 4 and the one main surface 2a.

The shield layer 6 covers the upper surface 5a and a side surface 5b of the sealing resin layer 5 and the side surface 2c of the substrate 2. The shield layer 6 is formed outside the inside of the recess 15 of the sealing resin layer 5. In other words, the shield layer 6 is not provided in the recess 15 of the sealing resin layer 5.

The shield layer 6 can be formed so as to have a multilayer structure including, for example, an adhesive layer stacked on the upper surface 5a and the side surface 5b of the sealing resin layer 5 and the side surface 2c of the substrate 2, an electrically conductive layer stacked on the adhesive layer, and a corrosion resistant layer stacked on the conductive layer. The adhesive layer is provided in order to increase the strength of adhesion between the electrically conductive layer, the sealing resin layer 5, and so on, and can for example be formed of a metal such as stainless steel. The electrically conductive layer is a layer that realizes the substantial shielding function of the shield layer 6, and can be formed of any metal among Cu, Ag, and Al, for example. The corrosion resistant layer is a layer that is provided in order to prevent corrosion of and damage to the electrically conductive layer, and can be formed of stainless steel, for example. For example, a sputtering method, a vapor deposition method, a paste coating method, and so on may be used when forming the shield layer 6.

(Method of Manufacturing Module)

Next, a method of manufacturing the module 1 will be described.

First, an agglomeration of substrates 2 is prepared, in which for each substrate 2, a plurality of land electrodes 7 are formed on the one main surface 2a, a plurality of outer electrodes 8 are formed on the other main surface 2b, and a plurality of inner electrodes (wiring electrodes, ground electrodes) 9 and a plurality of via conductors 10 and so forth are formed inside the substrate 2. The land electrodes 7, the outer electrodes 8, and the inner electrodes (wiring electrodes, ground electrodes) 9 can be formed by performing screen printing using an electrically conductive paste containing a metal such as Cu, Ag, or Al. Furthermore, the via conductors 10 can be forming using a known method after forming via holes using a laser or the like.

Next, the plurality of components including the first component 3 and the second component 4 are mounted on the one main surface 2a of each substrate 2 using a known surface mount technology. For example, the solder 11 is formed on desired land electrodes 7 among the land electrodes 7 of each substrate 2, the components are mounted on the corresponding land electrodes 7 among the land electrodes 7 on which the solder 11 has been formed, and then a reflow process is performed once the components have been mounted. The agglomeration of substrates 2 is washed as needed after the reflow process.

Next, a provisional sealing resin layer that forms the basis of the sealing resin layer 5 is formed on the one main surface 2a of each substrate 2 so as to cover the one main surface 2a of the substrate 2 and the components including the first component 3 and the second component 4 mounted on the one main surface 2a. For example, a transfer molding method, a compression molding method, a liquid resin method, a sheet resin method, and so forth may be used when forming the provisional sealing resin layer. A resin that is typically used as a sealing resin such as a silica-filler-containing epoxy resin can be used for the provisional sealing resin layer. In addition, a resin such as an epoxy resin containing a filler having a high thermal conductivity such as an alumina filler can be used in order to give the provisional sealing resin layer a high thermal conductivity. The agglomeration of substrates 2 is subjected to plasma washing as needed before forming the provisional sealing resin layer.

Next, resin is removed by radiating a laser onto a prescribed region between the first component 3 and the second component 4 in a plan view in a direction perpendicular to the one main surface 2a out of a surface of the provisional sealing resin layer on the opposite side from the surface thereof that faces the one main surface 2a, and as a result the sealing resin layer 5 in which the recess 15 is provided is formed. Here, for example, a UV laser, a $CO_2$ laser, a green laser, and so forth can be used as the laser.

Next, the provisional module prior to forming of the shield layer 6 that forms the basis of the modules 1 is divided into individual pieces by using a dicer or by performing laser processing.

After that, the shield layer 6 that covers the top surface 5a and the side surface 5b of the sealing resin layer 5 and the side surface 2c of the substrate 2 is formed on each provisional module, thus completing the process of manufacturing the module 1. For example, a mask is applied to the recess 15 of the sealing resin layer 5 in each provisional module, and in this state, the shield layer 6 is formed using, for example, a sputtering method, a vapor deposition method, a paste coating method, or the like.

According to the first embodiment described above, the recess 15 is formed in the sealing resin layer 5 between the first component 3 and the second component 4 in a plan view from a direction perpendicular to the one main surface 2a and the shield layer 6 is not provided in the recess 15 of the sealing resin layer 5. Therefore, unwanted electromagnetic waves generated by the first component 3 effectively exit to outside the module 1 via the recess 15 and are unlikely to reach the second component 4. Thus, the second component 4 is less likely to be affected by unwanted electromagnetic waves generated by the first component 3 and can operate stably.

Modification 1

Figure 2:
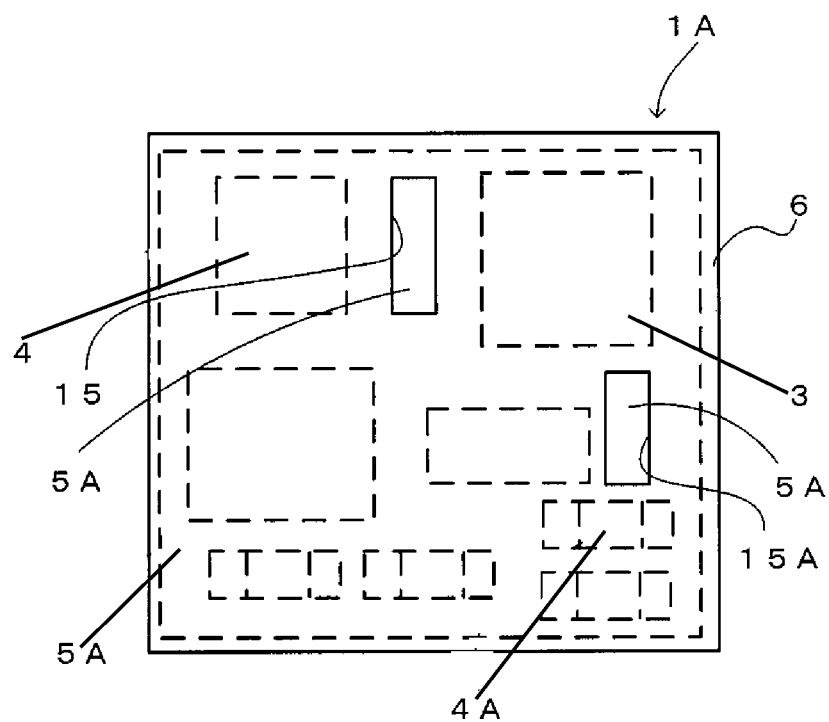
FIG. 2 is a plan view of a module according to modification 1 of the first embodiment of the present disclosure.

A module 1A according to modification 1 of the first embodiment of the present disclosure will be described while referring to FIG. 2. FIG. 2 is a plan view of the module 1A according to modification 1 of the first embodiment.

As illustrated in FIG. 2, the module 1A according to modification 1 of the first embodiment differs from the module 1 according to the first embodiment described using FIGS. 1A and 1B in that the module 1A is provided with recesses 15 and 15A in two places in a sealing resin layer 5A. Parts of the configuration that are the same as in the module 1 according to the first embodiment are denoted by the same reference symbols and description thereof is omitted.

The recess 15 is formed in the sealing resin layer 5A toward the one main surface 2a from a surface of the sealing resin layer 5A (hereinafter referred to as an "upper surface") that is farthest from one main surface 2a and on the opposite side from the surface of the sealing resin layer 5A that faces the one main surface 2a between the first component 3 and the second component 4 in a plan view from a direction perpendicular to the one main surface 2a. In addition, the recess 15A is formed in the sealing resin layer 5A toward the one main surface 2a from the surface of the sealing resin layer 5A including the upper surface of the sealing resin layer 5A between the first component 3 and a second component 4A, which is a region other than between the first component 3 and the second component 4, in a plan view from a direction perpendicular to the one main surface 2a. The second component 4A is a component that is affected by electromagnetic waves. The depths of the recesses 15 and 15A from the surface including the upper surface of the sealing resin layer 5A are depths with which the recesses 15 and 15A do not reach the one main surface 2a. The depths of the recesses 15 and 15A are not particularly limited, and may be, for example, depths with which the recesses 15 and 15A reach the one main surface 2a or may be depths with which the recesses 15 and 15A reach a prescribed position between a surface including a circuit mounting surface of the first component 3 or a surface mounting surface of the second component 4 and the one main surface 2a.

The shield layer 6 of the module 1A covers the upper surface and the side surface of the sealing resin layer 5A and the side surface 2c of the substrate 2. However, the shield layer 6 is not provided in the recesses 15 and 15A of the sealing resin layer 5A.

In addition, in modification 1, the first component 3 may be a component that is affected by electromagnetic waves and the second components 4 and 4A may be components that generate electromagnetic waves.

Second Embodiment

Figure 3:
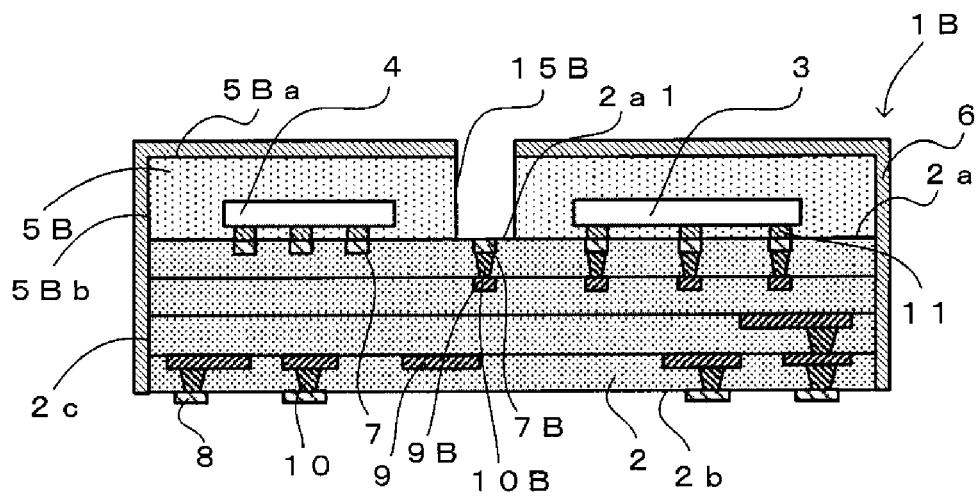
FIG. 3 is a sectional view of a module according to a second embodiment of the present disclosure.

A module 1B according to a second embodiment of the present disclosure will be described while referring to FIG. 3. FIG. 3 is a sectional view of the module 1B according to the second embodiment.

As illustrated in FIG. 3, the module 1B according to the second embodiment differs from the module 1 according to the first embodiment described using FIGS. 1A and 1B in that a recess 15B, through which a land electrode 7B is exposed from a sealing resin layer 5B, is provided in the sealing resin layer 5B in a region that overlaps the land electrode 7B formed on the one main surface 2a of the substrate 2 in a plan view from a direction perpendicular to the one main surface 2a. Parts of the configuration that are the same as in the module 1 according to the first embodiment are denoted by the same reference symbols and description thereof is omitted.

The recess 15B is formed in the sealing resin layer 5B toward the one main surface 2a up to a position that reaches the one main surface 2a from a surface of the sealing resin layer 5B including a surface (hereafter referred to as "upper surface") 5Ba of the sealing resin layer 5B that is farthest from the one main surface 2a and on the opposite side from the surface of the sealing resin layer 5B that faces the one main surface 2a so as to overlap the land electrode 7B formed on the one main surface 2a of the substrate 2 in a plan view from a direction perpendicular to the one main surface 2a. Thus, the land electrode 7B is exposed from the sealing resin layer 5B. The land electrode 7B corresponds to an "electrode" of the present disclosure.

The shield layer 6 covers the upper surface 5Ba and a side surface 5Bb of the sealing resin layer 5B and the side surface 2c of the substrate 2. However, the shield layer 6 is not provided in the recess 15B of the sealing resin layer 5B and in a region 2a1 of the one main surface 2a that is not covered by the sealing resin layer 5B. In other words, the land electrode 7B formed in the region 2a1 of the one main surface 2a is exposed to the outside.

The land electrode 7B, which is formed on the one main surface 2a and is exposed to the outside, is electrically connected to a wiring electrode 9B via a via conductor 11B, for example.

According to the above-described second embodiment, unwanted electromagnetic waves generated by the land electrode 7B formed on the one main surface 2a of the substrate 2 readily exit to outside the module 1B from the recess 15B of the sealing resin layer 5B. Thus, the second component 4, which is affected by electromagnetic waves, is unlikely to be affected by unwanted electromagnetic waves generated by the land electrode 7B formed in the region 2a1 of the one main surface 2a of the substrate 2 and can operate stably.

Third Embodiment

Figure 4:
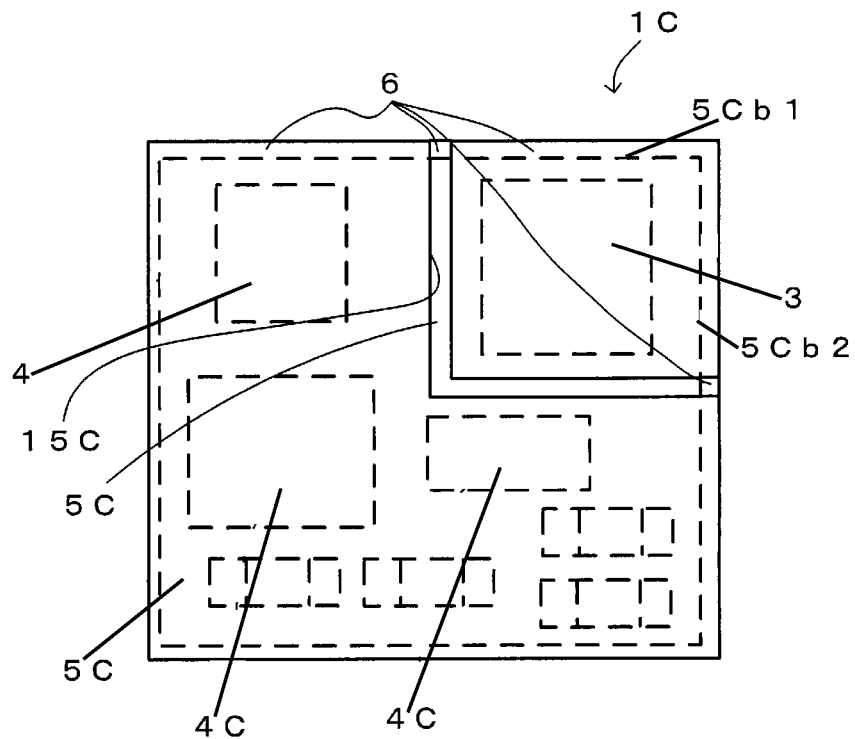
FIG. 4 is a plan view of a module according to a third embodiment of the present disclosure.

A module 1C according to a third embodiment of the present disclosure will be described while referring to FIG. 4. FIG. 4 is a plan view illustrating the module 1C according to the third embodiment.

As illustrated in FIG. 4, the module 1C according to the third embodiment differs from the module 1 according to the first embodiment described using FIGS. 1A and 1B in that a recess 15C is formed in a sealing resin layer 5C so as to pass between the first component 3 and second components 4 and 4C from one side surface 5Cb1 to another side surface 5Cb2 of the sealing resin layer 5C in a plan view from a direction perpendicular to the one main surface 2a. Parts of the configuration that are the same as in the module 1 according to the first embodiment are denoted by the same reference symbols and description thereof is omitted.

The recess 15C is formed in the sealing resin layer 5C toward the one main surface 2a from a surface of the sealing resin layer 5C (hereinafter referred to as an "upper surface") that is farthest from one main surface 2a and on the opposite side from the surface of the sealing resin layer 5C that faces the one main surface 2a so as to pass between the first component 3 and second components 4 and 4C from the one side surface 5Cb1 of the sealing resin layer 5C to the other side surface 5Cb2 of the sealing resin layer 5C that intersects the one side surface 5Cb1 in a plan view from a direction perpendicular to the one main surface 2a. The second component 4C is a component that is affected by electromagnetic waves. The depth of the recess 15C from the surface including the upper surface of the sealing resin layer 5C is a depth with which the recess 15C does not reach the one main surface 2a. The depth of the recess 15C is not particularly limited, and may be for example a depth with which the recess 15C reaches the one main surface 2a or may be a depth with which the recess 15C reaches a prescribed position between a surface including a circuit mounting surface of the first component 3 or a circuit mounting surface of the second components 4 and 4C and the one main surface 2a.

The shield layer 6 of the module 1C covers the upper surface and the side surface (including side surfaces 5Cb1 and 5Cb2) of the sealing resin layer 5C and the side surface 2c of the substrate 2. However, the shield layer 6 is not provided in the recess 15C of the sealing resin layer 5C.

The same effect is obtained with the above-described third embodiment as with the first embodiment.

In addition, in the third embodiment, the first component 3 may be a component that is affected by electromagnetic waves and the second components 4 and 4C may be components that generate electromagnetic waves. In addition, the recess 15C may be formed in the sealing resin layer 5C so as to pass between the first component 3 and the second components 4 and 4C from the side surface 5Cb1 of the sealing resin layer 5C to the side surface of the sealing resin layer 5C that faces the side surface 5Cb1 in a plan view from a direction perpendicular to the one main surface 2a.

Fourth Embodiment

Figure 5:
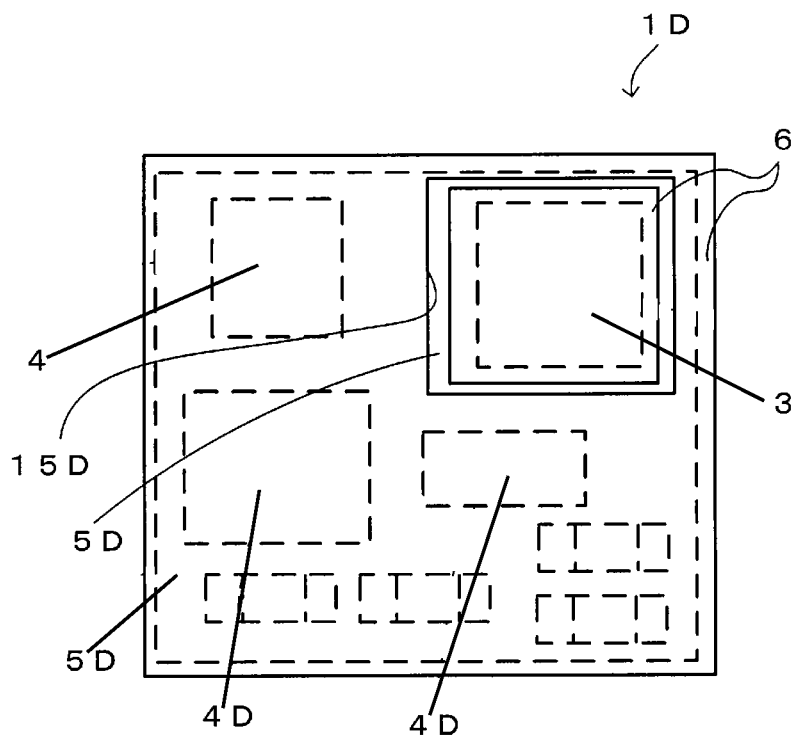
FIG. 5 is a plan view of a module according to a fourth embodiment of the present disclosure.

A module 1D according to a fourth embodiment of the present disclosure will be described while referring to FIG. 5. FIG. 5 is a plan view illustrating the module 1D according to the fourth embodiment.

As illustrated in FIG. 5, the module 1D according to the fourth embodiment differs from the module 1 according to the first embodiment described using FIGS. 1A and 1B in that a recess 15D is provided outside the first component 3 so as to pass between the first component 3 and second components 4 and 4D and surround the entire periphery of the first component 3 in a plan view from a direction perpendicular to the one main surface 2a. Parts of the configuration that are the same as in the module 1 according to the first embodiment are denoted by the same reference symbols and description thereof is omitted.

The recess 15D is formed in a sealing resin layer 5D toward the one main surface 2a from a surface of the sealing resin layer 5D (hereinafter referred to as an "upper surface") that is farthest from one main surface 2a and on the opposite side from the surface of the sealing resin layer 5D that faces the one main surface 2a so as to be outside the first component 3 and pass between the first component 3 and the second components 4 and 4D and surround the entire periphery of the first component 3 in a plan view from a direction perpendicular to the one main surface 2a. The second component 4D is assumed to be a component that is affected by electromagnetic waves. The depth of the recess 15D from the surface including the upper surface of the sealing resin layer 5D is a depth with which the recess 15D does not reach the one main surface 2a. The depth of the recess 15D is not particularly limited, and may be for example a depth with which the recess 15D reaches the one main surface 2a or may be a depth with which the recess 15D reaches a prescribed position between a surface including a circuit mounting surface of the first component 3 or a circuit mounting surface of the second components 4 and 4D and the one main surface 2a.

The shield layer 6 of the module 1D covers the upper surface and the side surface of the sealing resin layer 5D and the side surface 2c of the substrate 2. However, the shield layer 6 is not provided in the recess 15D of the sealing resin layer 5D.

The same effect is obtained with the above-described fourth embodiment as with the first embodiment.

In addition, in the fourth embodiment, the recess 15D is provided in the sealing resin layer 5D outside the first component 3, which generates electromagnetic waves, so as to pass between the first component 3 and the second components 4 and 4D, which are affected by electromagnetic waves, and surround the entire periphery of the first component 3 in a plan view from a direction perpendicular to the one main surface 2a, but the configuration is not limited to this example, and for example, the following configuration may instead be adopted. A recess may be provided in the sealing resin layer outside a component that is affected by electromagnetic waves so as to pass between the component that is affected by electromagnetic waves and a component that generates electromagnetic waves and surround the entire periphery of the component that is affected by electromagnetic waves in a plan view from a direction perpendicular to the one main surface 2a.

Fifth Embodiment

Figure 6A:
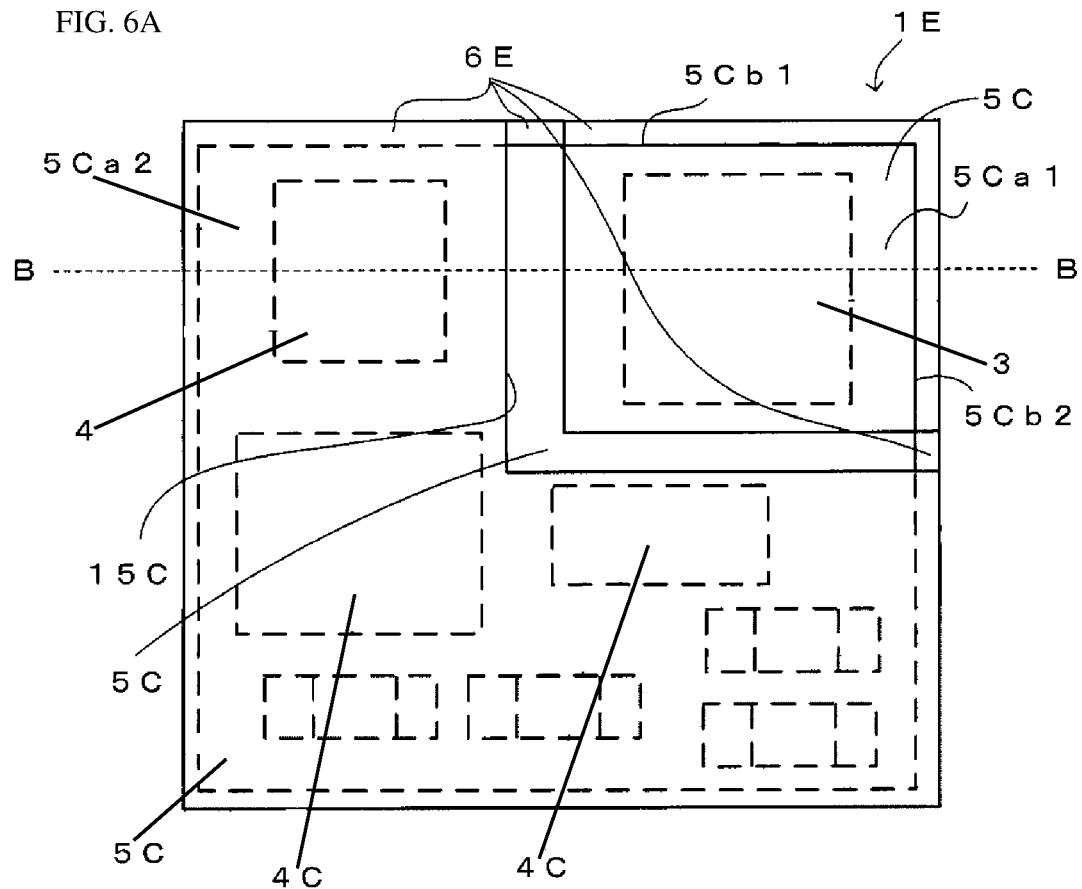
FIG. 6A is a plan view of a module according to a fifth embodiment of the present disclosure and FIG. 6B is a sectional view taken along line B-B in FIG. 6A.

A module 1E according to a fifth embodiment of the present disclosure will be described while referring to FIGS. 6A and 6B. FIG. 6A is a plan view of the module 1E according to the fifth embodiment and FIG. 6B is a sectional view taken along line B-B in FIG. 6A.

Figure 6B:
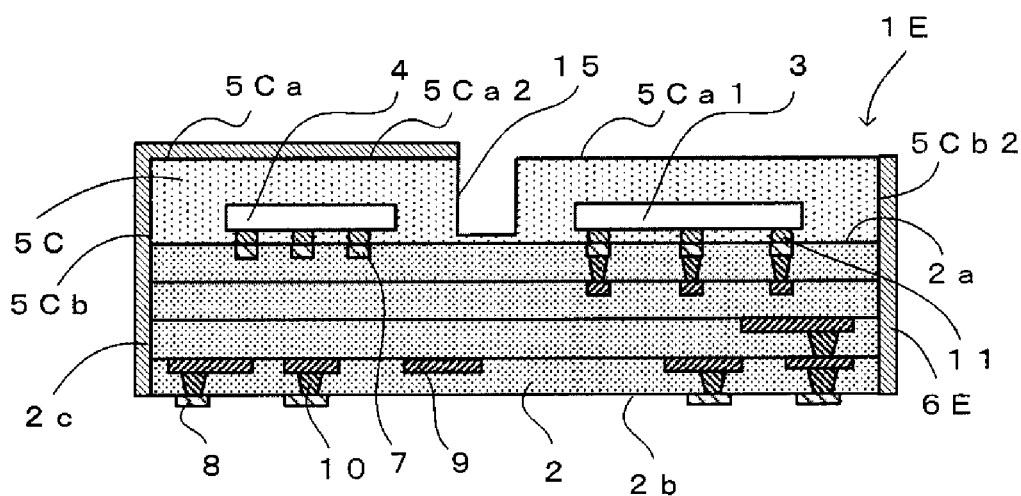

As illustrated in FIGS. 6A and 6B, the module 1E according to the fifth embodiment of the present disclosure differs from the module 1C according to the third embodiment described using FIG. 4 in that a shield layer 6E does not cover part of a surface (hereafter referred to as "upper surface") 5Ca of the sealing resin layer 5C that is farthest from one main surface 2a and on the opposite side from the surface of the sealing resin layer 5C that faces the one main surface 2a. Parts of the configuration that are the same as in the module 1C according to the third embodiment are denoted by the same reference symbols and description thereof is omitted.

The upper surface 5Ca of the sealing resin layer 5C is divided by the recess 15C into a first region 5Ca1, which is on a side that overlaps the first component 3, and a second region 5Ca2, which on a side that overlaps the second components 4 and 4C, in a plan view from a direction perpendicular to the one main surface 2a.

The shield layer 6E covers the second region 5Ca2 of the upper surface 5Ca and a side surface 5Cb (including side surfaces 5Cb1 and 5Cb2) of the sealing resin layer 5C and the side surface 2c of the substrate 2. However, the shield layer 6E is not provided in the recess 15C of the sealing resin layer 5C and on the first region 5Ca1 of the upper surface 5Ca of the sealing resin layer 5C.

According to the above-described fifth embodiment, electromagnetic waves generated by the first component 3 exit to outside the module 1E from the recess 15C and are also able to exit to outside the module 1E from the first region 5Ca1 of the upper surface 5Ca of the sealing resin layer 5C where the shield layer 6E is not provided and are less likely to reach the second components 4 and 4C. Thus, the second components 4 and 4C are less likely to be affected by the unwanted electromagnetic waves generated by the first component 3 and can operate more stably.

In addition, in the fifth embodiment, although the shield layer 6E is provided on the second region 5Ca2 of the upper surface 5Ca of the sealing resin layer 5C, which is on the side overlapping the second components 4 and 4C that are affected by electromagnetic waves, and the shield layer 6E is not provided on the first region 5Ca1 of the upper surface 5Ca of the sealing resin layer 5C, which is on the side overlapping the first component 3 that generates electromagnetic waves, in a plan view from a direction perpendicular to the one main surface 2a, the configuration is not limited to this example and the following configuration may instead be adopted. The shield layer 6E may be provided on the first region 5Ca1, which is on the side overlapping the first component 3 that generates electromagnetic waves, and the shield layer 6E may not be provided on the second region 5Ca2, which is on the side overlapping the second components 4 and 4C that are affected by electromagnetic waves, in a plan view from a direction perpendicular to the one main surface 2a. In this case, even if unwanted electromagnetic waves generated by the first component 3 enter the part of the sealing resin layer 5C that covers the second components 4 and 4C via the recess 15C, the unwanted electromagnetic waves will exit to outside the module 1E from the second region 5Ca2 of the upper surface 5Ca of the sealing resin layer 5C where the shield layer 6E is not provided and are unlikely to reach the second components 4 and 4C. Thus, the second components 4 and 4C are less likely to be affected by the unwanted electromagnetic waves generated by the first component 3 and can operate more stably.

Sixth Embodiment

Figure 7A:
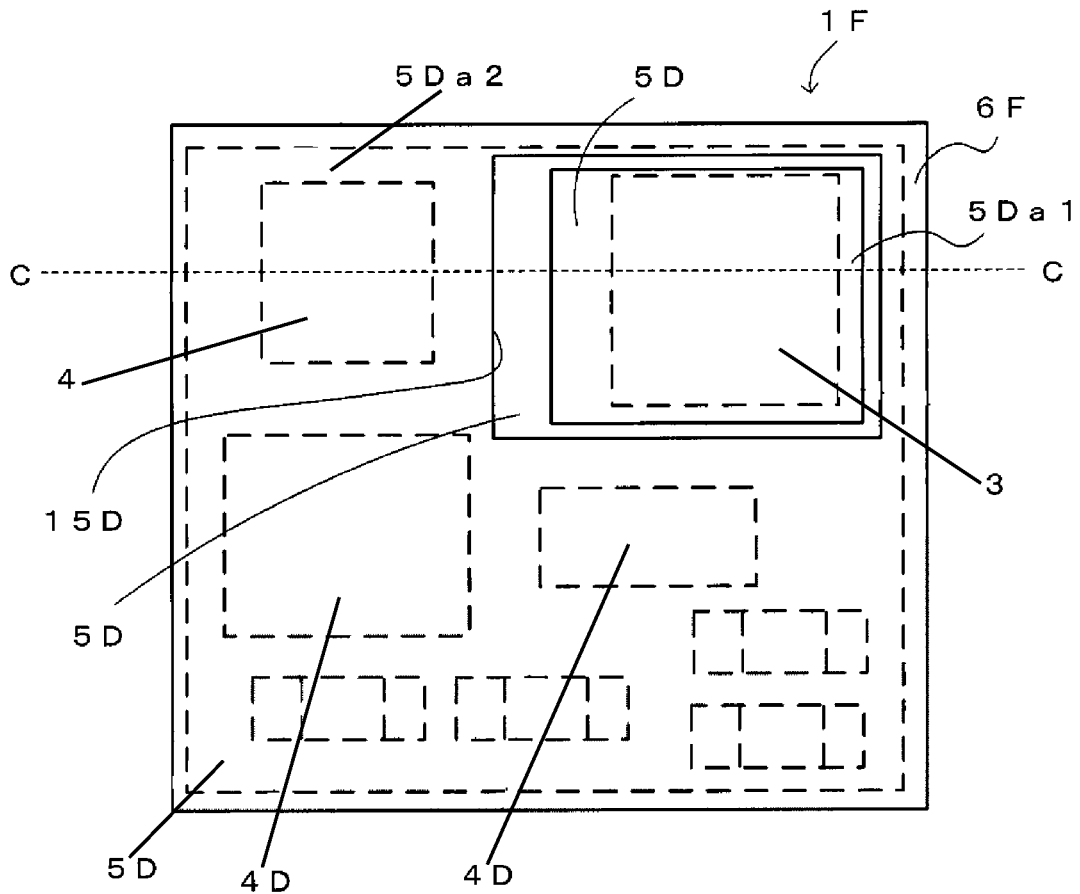
FIG. 7A is a plan view of a module according to a sixth embodiment of the present disclosure and FIG. 7B is a sectional view taken along line C-C in FIG. 7A.

A module 1F according to a sixth embodiment of the present disclosure will be described while referring to FIGS. 7A and 7B. FIG. 7A is a plan view of the module 1F according to the sixth embodiment and FIG. 7B is a sectional view taken along line C-C in FIG. 7A.

Figure 7B:
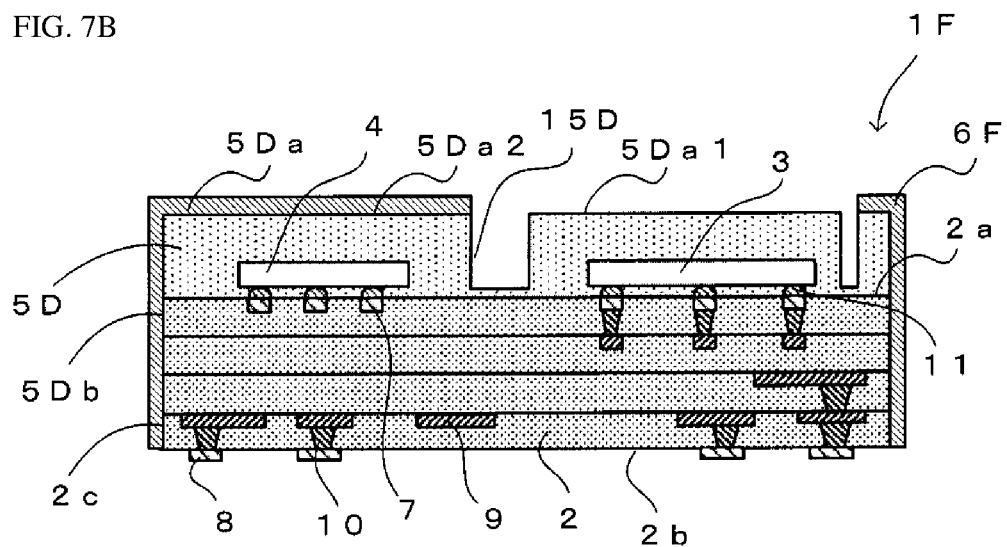

As illustrated in FIGS. 7A and 7B, the module 1F according to the sixth embodiment of the present disclosure differs from the module 1D according to the fourth embodiment described using FIG. 5 in that a shield layer 6F does not cover part of a surface (hereafter referred to as "upper surface") 5Da of a sealing resin layer 5D that is farthest from the one main surface 2a and on the opposite side from the surface of the sealing resin layer 5D that faces the one main surface 2a. Parts of the configuration that are the same as in the module 1D according to the fourth embodiment are denoted by the same reference symbols and description thereof is omitted.

The upper surface 5Da of the sealing resin layer 5D is divided by the recess 15D into a first region 5Da1, which is on a side that overlaps the first component 3, and a second region 5Da2, which on a side that overlaps the second components 4 and 4D, in a plan view from a direction perpendicular to the one main surface 2a.

The shield layer 6F covers the second region 5Da2 of the upper surface 5Da and a side surface 5Db of the sealing resin layer 5D and the side surface 2c of the substrate 2. However, the shield layer 6F is not provided in the recess 15D of the sealing resin layer 5D and on the first region 5Da1 of the upper surface 5Da of the sealing resin layer 5D.

The same effect is obtained with the above-described sixth embodiment as with the fifth embodiment.

In addition, in the sixth embodiment, although the shield layer 6F is provided on the second region 5Da2 of the upper surface 5Da of the sealing resin layer 5D, which is on the side overlapping the second components 4 and 4D that are affected by electromagnetic waves, and the shield layer 6F is not provided on the first region 5Da1 of the upper surface 5Da of the sealing resin layer 5D, which is on the side overlapping the first component 3 that generates electromagnetic waves, in a plan view from a direction perpendicular to the one main surface 2a, the configuration is not limited to this example and the following configuration may instead be adopted. The shield layer 6F may be provided on the first region 5Da1, which is on the side overlapping the first component 3 that generates electromagnetic waves, and the shield layer 6F may not be provided on the second region 5Da2, which is on the side overlapping the second components 4 and 4D that are affected by electromagnetic waves, in a plan view from a direction perpendicular to the one main surface 2a.

In addition, in the sixth embodiment, the recess 15D is provided in the sealing resin layer 5D outside the first component 3, which generates electromagnetic waves, so as to pass between the first component 3 and the second components 4 and 4D, which are affected by electromagnetic waves, and surround the entire periphery of the first component 3 in a plan view from a direction perpendicular to the one main surface 2a, but the configuration is not limited to this example, and for example, the following configuration may be adopted. A recess may be provided in the sealing resin layer outside a component that is affected by electromagnetic waves so as to pass between the component that is affected by electromagnetic waves and a component that generates electromagnetic waves and surround the entire periphery of the component that is affected by electromagnetic waves in a plan view from a direction perpendicular to the one main surface 2a. In this case, the surface of the sealing resin layer (hereafter referred to as "upper surface") that is farthest away from the one main surface 2a and is on the opposite side from the surface of the sealing resin layer that faces the one main surface 2a is divided by a recess into a first region, which is on a side that overlaps the component that generates electromagnetic waves, and a second region, which on a side that overlaps the component that is affected by electromagnetic waves, in a plan view from a direction perpendicular to the one main surface 2a. The shield layer may be provided on the second region and the shield layer may not be provided on the first region. Alternatively, the shield layer may be provided on the first region and the shield layer may not be provided on the second region.

Furthermore, the shield layer 6F may be provided so as not to cover the side surface 5Db of the sealing resin layer 5D in the sixth embodiment and modifications thereof.

Seventh Embodiment

Figure 8A:
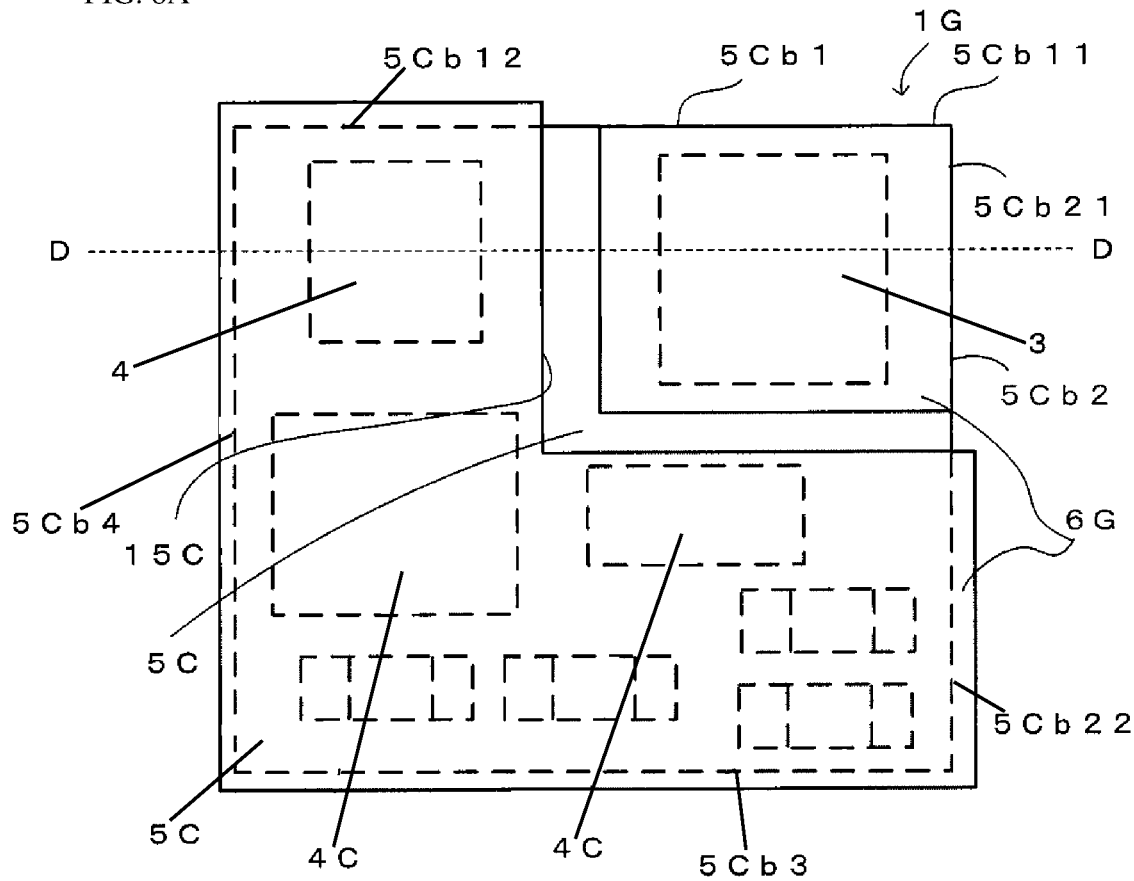
FIG. 8A is a plan view of a module according to a seventh embodiment of the present disclosure and FIG. 8B is a sectional view taken along line D-D in FIG. 8A.

A module 1G according to a seventh embodiment of the present disclosure will be described while referring to FIGS. 8A and 8B. FIG. 8A is a plan view of the module 1G according to the seventh embodiment and FIG. 8B is a sectional view taken along line D-D in FIG. 8A.

Figure 8B:
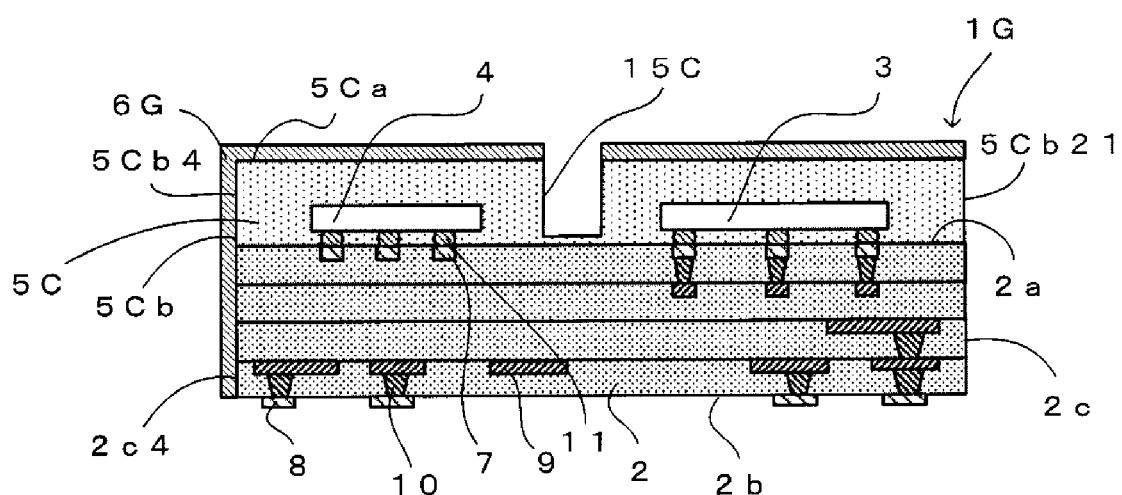

As illustrated in FIGS. 8A and 8B, the module 1G according to the seventh embodiment of the present disclosure differs from the module 1C according to the third embodiment described using FIG. 4 in that a shield layer 6G does not cover part of the side surface of the sealing resin layer 5C that surrounds the first component 3 together with the recess 15C. Parts of the configuration that are the same as in the module 1C according to the third embodiment are denoted by the same reference symbols and description thereof is omitted.

The side surface 5Cb1 of the sealing resin layer 5C that is connected to the recess 15C is divided by the recess 15C into a first region 5Cb11 that is on the side close to the first component 3 and a second region 5Cb12 that is on the side close to the second component 4. In addition, the side surface 5Cb2 of the sealing resin layer 5C that is connected to the recess 15C is divided by the recess 15C into a first region 5Cb21 that is on the side close to the first component 3 and a second region 5Cb22 that is on the side close to the second component 4C.

The shield layer 6G covers the upper surface 5Ca of the sealing resin layer 5C, the second region 5Cb12 of the side surface 5Cb1 of the sealing resin layer 5C, the second region 5Cb22 of the side surface 5Cb2, a side surface 5Cb3 and a side surface 5Cb4, and part of the side surface 2c of the substrate 2. The part of the side surface 2c of the substrate 2 that is covered by the shield layer 6G is the region of the side surface 2c that is interposed between the part of the one main surface 2a that overlaps the second region 5Cb12 of the side surface 5Cb1, the second region 5Cb22 of the side surface 5Cb2, the side surface 5Cb3, and the side surface 5Cb4 and the part of the other main surface 2b that overlaps the second region 5Cb12 of the side surface 5Cb1, the second region 5Cb22 of the side surface 5Cb2, the side surface 5Cb3, and the side surface 5Cb4 (side surface 2c4 and so on of substrate 2 in FIG. 8B) in a plan view from a direction perpendicular to the one main surface 2a. However, the shield layer 6G is not provided in the recess 15C of the sealing resin layer 5C, on the first region 5Cb11 of the side surface 5Cb1 of the sealing resin layer 5C, on the first region 5Cb21 of the side surface 5Cb2, and on the parts between the ends of the bottom surface of the recess 15C on the side surface 5Cb1 and the side surface 5Cb2 and the one main surface 2a, and on remaining parts of the side surface 2c of the substrate 2 other than the above-described parts. The part including the first region 5Cb11 of the side surface 5Cb1 and the first region 5Cb21 of the side surface 5Cb2 of the sealing resin layer 5C corresponds to a "first side surface portion" of the present disclosure. In addition, the part including the second region 5Cb12 of the side surface 5Cb1, the second region 5Cb22 of the side surface 5Cb2, the side surface 5Cb3, and the side surface 5Cb4 of the sealing resin layer 5C corresponds to a "second side surface portion".

According to the above-described seventh embodiment, electromagnetic waves generated by the first component 3 exit to outside the module 1G from the recess 15C and also exit to outside the module 1G to from the first region 5Cb11 and the first region 5Cb21 of the side surface 5Cb of the sealing resin layer 5C and are less likely to reach the second components 4 and 4C. Thus, the second components 4 and 4C are less likely to be affected by the unwanted electromagnetic waves generated by the first component 3 and can operate more stably.

In addition, in the seventh embodiment, with respect to the side surface 5Cb of the sealing resin layer 5C, the shield layer 6G is not provided on the first region 5Cb11 of the side surface 5Cb1 and the first region 5Cb21 of the side surface 5Cb2 of the sealing resin layer 5C that surround, together with the recess 15C, the first component 3, which is a component that generates electromagnetic waves, and the shield layer 6G is provided on the second region 5Cb12 of the side surface 5Cb1, the second region 5Cb22 of the side surface 5Cb2, the side surface 5Cb3, and the side surface 5Cb4 of the sealing resin layer 5C that surround, together with the recess 15C, the second components 4 and 4C, which are components that are affected by electromagnetic waves, but the configuration is not limited to this example and the following configuration may instead be adopted. With respect to the side surface 5Cb of the sealing resin layer 5C, the shield layer 6G may be provided on the first region 5Cb11 of the side surface 5Cb1 and the first region 5Cb21 of the side surface 5Cb2 of the sealing resin layer 5C that surround, together with the recess 15C, the first component 3, which is a component that generates electromagnetic waves, and the shield layer 6G may not be provided on the second region 5Cb12 of the side surface 5Cb1, the second region 5Cb22 of the side surface 5Cb2, the side surface 5Cb3, and the side surface 5Cb4 of the sealing resin layer 5C that surround, together with the recess 15C, the second components 4 and 4C, which are components that are affected by electromagnetic waves. In this case, even if unwanted electromagnetic waves generated by the first component 3 enter the part of the sealing resin layer 5C that covers the second components 4 and 4C via the recess 15C, the unwanted electromagnetic waves will exit to outside the module 1G from the second region 5Cb12 of the side surface 5Cb1, the second region 5Cb22 of the side surface 5Cb2, the side surface 5Cb3, and the side surface 5Cb4 of the side surface 5Cb of the sealing resin layer 5C where the shield layer 6G is not provided and are not likely to reach the second components 4 and 4C. Thus, the second components 4 and 4C are less likely to be affected by the unwanted electromagnetic waves generated by the first component 3 and can operate more stably.

Modification 1

Figure 9:
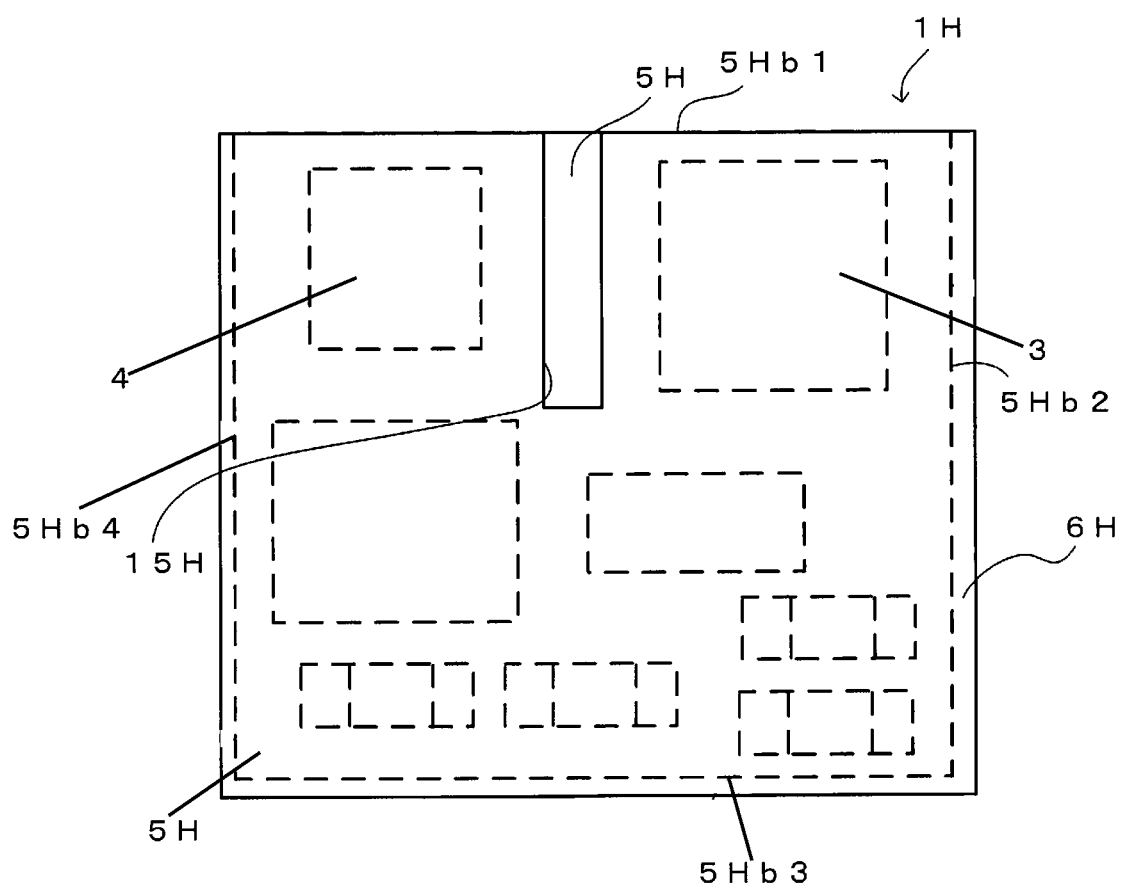
FIG. 9 is a plan view of a module according to modification 1 of the seventh embodiment of the present disclosure.

A module 1H according to a modification 1 of the seventh embodiment of the present disclosure will be described while referring to FIG. 9. FIG. 9 is a plan view of the module 1H according to modification 1 of the seventh embodiment.

As illustrated in FIG. 9, the module 1H according to modification 1 of the seventh embodiment of the present disclosure differs from the module 1G according to the seventh embodiment described using FIGS. 8A and 8B in that a recess 15H is formed in a sealing resin layer 5H from one side surface 5Hb1 toward another side surface 5Hb3 of the sealing resin layer 5H so as pass between the first component 3 and the second component 4 and extend up to a position where the recess 15H does not reach the other side surface 5Hb3 in a plan view from a direction perpendicular to the one main surface 2a, and a shield layer 6H does not cover the entire side surface 5Hb1 of the sealing resin layer 5H that is connected to the recess 15H. Parts of the configuration that are the same as in the module 1G according to the seventh embodiment are denoted by the same reference symbols and description thereof is omitted.

The recess 15H is formed in the sealing resin layer 5H toward the one main surface 2a from a surface of the sealing resin layer 5H (hereinafter referred to as an "upper surface") that is farthest from one main surface 2a and on the opposite side from the surface of the sealing resin layer 5H that faces the one main surface 2a so as to pass between the first component 3 and second component 4 from the one side surface 5Hb1 toward the other side surface 5Hb3 of the sealing resin layer 5H up to a position where the recess 15H does not reach the other side surface 5Hb3 of the sealing resin layer 5H in a plan view from a direction perpendicular to the one main surface 2a. The depth of the recess 15H from the surface including the upper surface of the sealing resin layer 5H is a depth with which the recess 15H does not reach the one main surface 2a. The depth of the recess 15H is not particularly limited, and may be, for example, a depth with which the recess 15H reaches the one main surface 2a or may be a depth with which the recess 15H reaches a prescribed position between a surface including a circuit mounting surface of the first component 3 or a circuit mounting surface of the second component 4 and the one main surface 2a.

The shield layer 6H covers the upper surface and side surfaces 5Hb2, 5Hb3, and 5Hb4 of the sealing resin layer 5H and part of the side surface 2c of the substrate 2. The part of the side surface 2c of the substrate 2 that is covered by the shield layer 6H is a region of the side surface 2c disposed between the part of the one main surface 2a overlapping the side surfaces 5Hb2, 5Hb3, and 5Hb4 and the part of the other main surface 2b overlapping the 5Hb2, 5Hb3, and 5Hb4 in a plan view from a direction perpendicular to the one main surface 2a. However, the shield layer 6H is not provided in the recess 15H of the sealing resin layer 5H, on the side surface 5Hb1 of the sealing resin layer 5H, and on the remaining part of the side surface 2c of the substrate 2 other than the part described above.

Eighth Embodiment

Figure 10A:
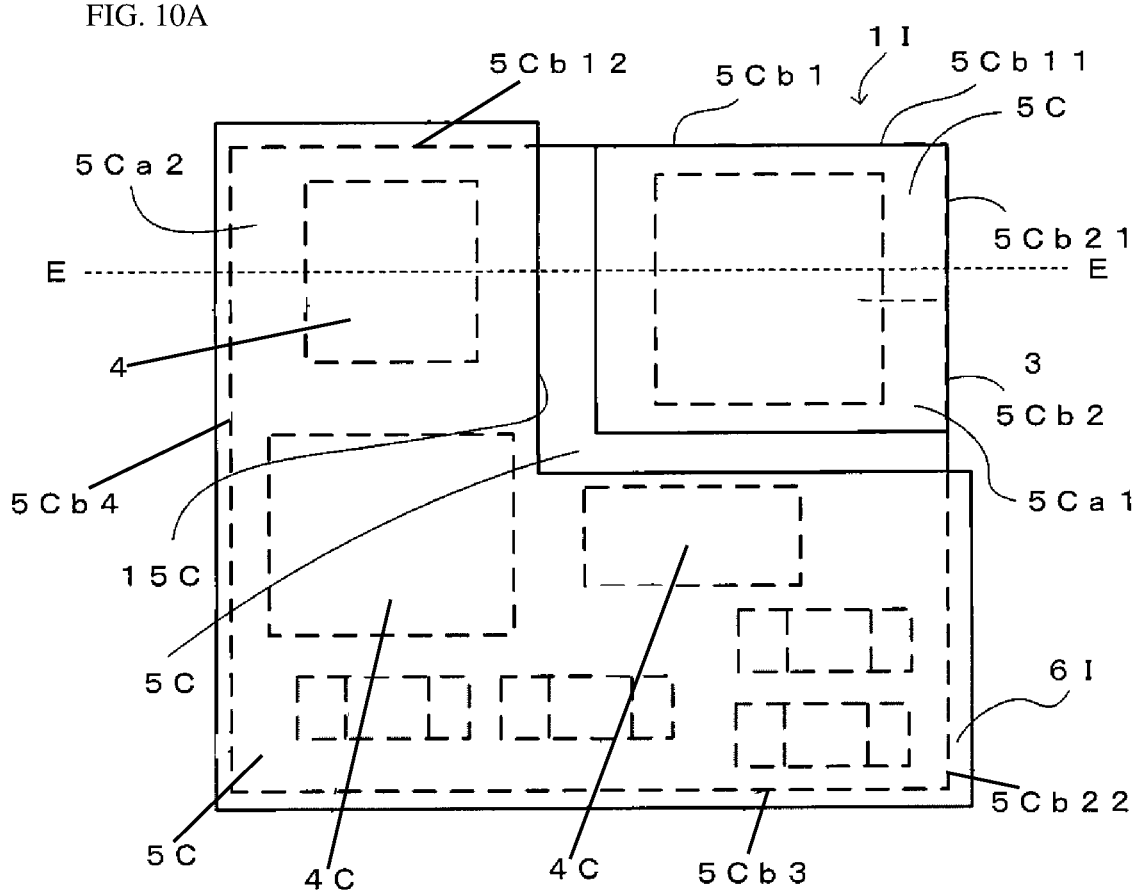
FIG. 10A is a plan view of a module according to an eighth embodiment of the present disclosure and FIG. 10B is a sectional view taken along line E-E in FIG. 10A.

A module 1I according to an eighth embodiment of the present disclosure will be described while referring to FIGS. 10A and 10B. FIG. 10A is a plan view of the module 1I according to the eighth embodiment and FIG. 10B is a sectional view taken along line E-E in FIG. 10A.

Figure 10B:
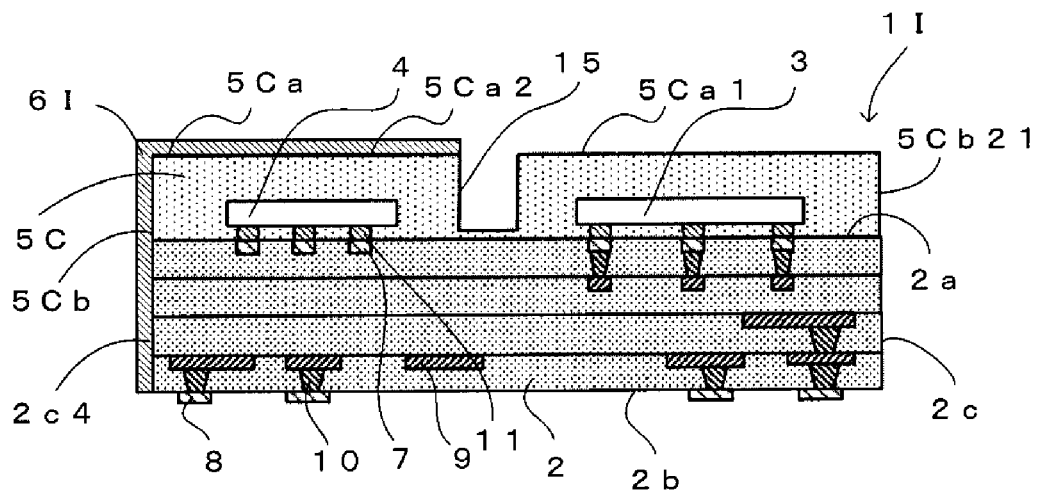

As illustrated in FIGS. 10A and 10B, the module 1I according to the eighth embodiment of the present disclosure differs from the module 1G according to the seventh embodiment described using FIGS. 8A and 8B in that a shield layer 6I does not cover part of the upper surface 5Ca of the sealing resin layer 5C. Parts of the configuration that are the same as in the module 1G according to the seventh embodiment are denoted by the same reference symbols and description thereof is omitted.

The upper surface 5Ca of the sealing resin layer 5C is divided by the recess 15C into the first region 5Ca1, which is on a side that overlaps the first component 3, and a second region 5Ca2, which on a side that overlaps the second components 4 and 4C, in a plan view from a direction perpendicular to the one main surface 2a. In addition, the side surface 5Cb1 of the sealing resin layer 5C that is connected to the recess 15C is divided by the recess 15C into the first region 5Cb11 that is on the side close to the first component 3 and the second region 5Cb12 that is on the side close to the second component 4. Furthermore, the side surface 5Cb2 of the sealing resin layer 5C that is connected to the recess 15C is divided by the recess 15C into the first region 5Cb21 that is on the side close to the first component 3 and the second region 5Cb22 that is on the side close to the second component 4C.

The shield layer 6I covers the second region 5Ca2 of the upper surface 5Ca of the sealing resin layer 5C, the second region 5Cb12 of the side surface 5Cb1 of the sealing resin layer 5C, the second region 5Cb22 of the side surface 5Cb2, the side surface 5Cb3, and the side surface 5Cb4, and part of the side surface 2c of the substrate 2. The part of the side surface 2c of the substrate 2 that is covered by the shield layer 6I is the region of the side surface 2c that is interposed between the part of the one main surface 2a that overlaps the second region 5Cb12 of the side surface 5Cb1, the second region 5Cb22 of the side surface 5Cb2, the side surface 5Cb3, and the side surface 5Cb4 and the part of the other main surface 2b that overlaps the second region 5Cb12 of the side surface 5Cb1, the second region 5Cb22 of the side surface 5Cb2, the side surface 5Cb3, and the side surface 5Cb4 (side surface 2c4 and so on of substrate 2 in FIG. 10B) in a plan view from a direction perpendicular to the one main surface 2a. However, the shield layer 6I is not provided in the recess 15C of the sealing resin layer 5C, on the first region 5Ca1 of the upper surface 5Ca of the sealing resin layer 5C, on the first region 5Cb11 of the side surface 5Cb1 and on the first region 5Cb21 of the side surface 5Cb2 of the sealing resin layer 5C, and on the parts between the ends of the bottom surface of the recess 15C on the side surface 5Cb1 and the side surface 5Cb2 and the one main surface 2a, and on remaining parts of the side surface 2c of the substrate 2 other than the above-described parts.

According to the above-described eighth embodiment, electromagnetic waves generated by the first component 3 exit to outside the module 1I from the recess 15C and also exit to outside the module 1I from the first region 5Cb11 and the first region 5Cb21 of the side surface 5Cb of the sealing resin layer 5C and the first region 5Ca1 of the upper surface 5Ca of the sealing resin layer 5C and are less likely to reach the second components 4 and 4C. Thus, the second components 4 and 4C are less likely to be affected by the unwanted electromagnetic waves generated by the first component 3 and can operate more stably.

In addition, in the eighth embodiment, with respect to the side surface 5Cb of the sealing resin layer 5C, the shield layer 6I is not provided on the first region 5Cb11 of the side surface 5Cb1 and the first region 5Cb21 of the side surface 5Cb2 of the sealing resin layer 5C that surround, together with the recess 15C, the first component 3, which is a component that generates electromagnetic waves, and the shield layer 6I is provided on the second region 5Cb12 of the side surface 5Cb1, the second region 5Cb22 of the side surface 5Cb2, the side surface 5Cb3, and the side surface 5Cb4 of the sealing resin layer 5C that surround, together with the recess 15C, the second components 4 and 4C, which are components that are affected by electromagnetic waves, and with respect to the upper surface 5Ca of the sealing resin layer 5C, the shield layer 6I is not provided on the first region 5Ca1, which is on the side overlapping the first component 3 that generates electromagnetic waves, and is provided on the second region 5Ca2, which is on the side overlapping the second components 4 and 4C, which are components that are affected by electromagnetic waves, in a plan view from a direction perpendicular to the one main surface 2a, but the configuration is not limited to this example and the following configuration may instead be adopted. With respect to the side surface 5Cb of the sealing resin layer 5C, the shield layer 6I may be provided on the first region 5Cb11 of the side surface 5Cb1 and the first region 5Cb21 of the side surface 5Cb2 of the sealing resin layer 5C that surround, together with the recess 15C, the first component 3, which is a component that generates electromagnetic waves, and the shield layer 6I may not be provided on the second region 5Cb12 of the side surface 5Cb1, the second region 5Cb22 of the side surface 5Cb2, the side surface 5Cb3, and the side surface 5Cb4 of the sealing resin layer 5C that surround, together with the recess 15C, the second components 4 and 4C, which are components that are affected by electromagnetic waves, and with respect to the upper surface 5Ca of the sealing resin layer 5C, the shield layer 6I may be provided on the first region 5Ca1, which is on the side overlapping the first component 3 that generates electromagnetic waves, and may not be provided on the second region 5Ca2, which is on the side overlapping the second components 4 and 4C, which are components that are affected by electromagnetic waves, in a plan view from a direction perpendicular to the one main surface 2a. In this case, even if unwanted electromagnetic waves generated by the first component 3 enter the part of the sealing resin layer 5C that covers the second components 4 and 4C via the recess 15C, the unwanted electromagnetic waves will exit to outside the module 1I from the second region 5Cb12 of the side surface 5Cb1, the second region 5Cb22 of the side surface 5Cb2, the side surface 5Cb3, and the side surface 5Cb4 of the side surface 5Cb of the sealing resin layer 5C where the shield layer 6I is not provided and from the second region 5Ca2 of the upper surface 5Ca of the sealing resin layer 5C where the shield layer 6I is not provided and are unlikely to reach the second components 4 and 4C. Thus, the second components 4 and 4C are less likely to be affected by the unwanted electromagnetic waves generated by the first component 3 and can operate more stably.

Ninth Embodiment

Figure 11:
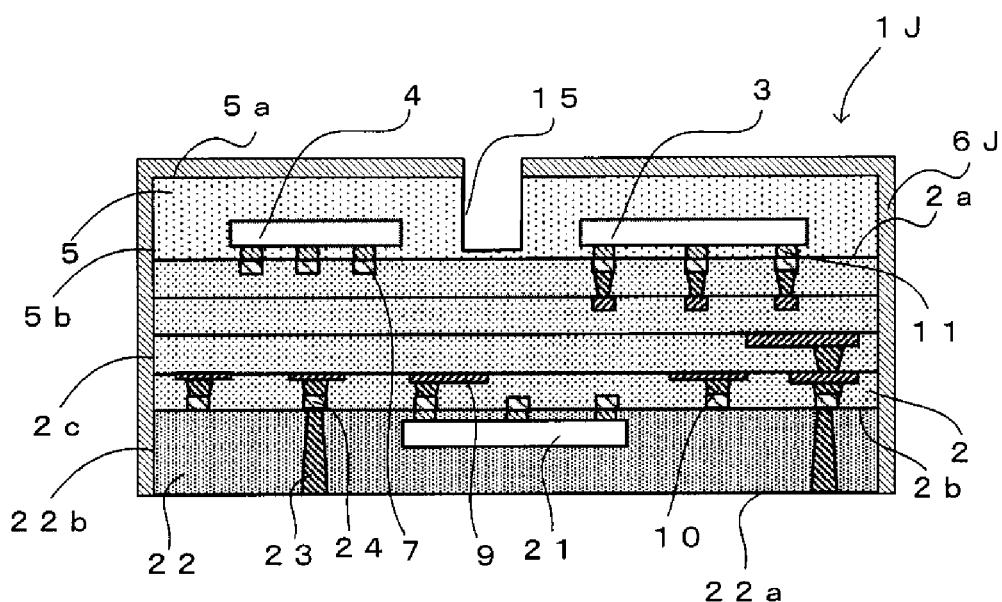
FIG. 11 is a sectional view of a module according to a ninth embodiment of the present disclosure.

A module 1J according to a ninth embodiment of the present disclosure will be described while referring to FIG. 11. FIG. 11 is a sectional view of the module 1J according to the ninth embodiment.

As illustrated in FIG. 11, the module 1J according to the ninth embodiment differs from the module 1 according to the first embodiment described using FIGS. 1A and 1B in that components are mounted on both the one main surface 2a and the other main surface 2b of the substrate 2. Parts of the configuration that are the same as in the module 1 according to the first embodiment are denoted by the same reference symbols and description thereof is omitted.

A plurality of land electrodes 7 are formed on the one main surface 2a of the substrate 2, a plurality of land electrode 24 are formed on the other main surface 2b of the substrate 2, and a plurality of inner electrodes (wiring electrodes, ground electrodes) 9 and via conductors 10 are formed inside the substrate 2. The land electrodes 24 are formed of a metal that is typically used for electrodes such as Cu, Ag, Al, or the like.

A third component 21 is mounted on the other main surface 2b of the substrate 2 by for example connecting connection terminals thereof to the land electrodes 24 formed on the other main surface 2b of the substrate 2 using solder 11.

A sealing resin layer 22 seals the other main surface 2b and the third component 21 so as to cover the other main surface 2b and the third component 21. The sealing resin layer 22 can be formed of a resin that is typically employed as a sealing resin such as an epoxy resin containing a silica filler. In addition, it is also possible to use a resin such as an epoxy resin containing a filler having a high thermal conductivity such as an alumina filler for the sealing resin layer 22 in order to realize high heat conduction. The sealing resin layer 22 corresponds to "another sealing resin layer" of the present disclosure.

A plurality of connection conductors 23 that extend from a surface (hereafter, referred to as "lower surface") 22a of the sealing resin layer 22, which is on the opposite side from the surface of the sealing resin layer 22 that faces the other main surface 2b, to the land electrodes 24 formed on the other main surface 2b are provided in the sealing resin layer 22. One end surfaces of the connection conductors 23 are exposed from the lower surface 22a of the sealing resin layer 22 and are electrically connected to an external device. In addition, the other end surfaces of the connection conductors 23 are electrically connected to the land electrodes 24 formed on the other main surface 2b. The connection conductors 23 are formed of a metal such as copper.

A shield layer 6J covers the upper surface 5a and the side surface 5b of the sealing resin layer 5, the side surface 2c of the substrate 2, and a side surface 22b of the sealing resin layer 22. However, the shield layer 6J is not provided in the recess 15 of the sealing resin layer 5 and on the lower surface 22a of the sealing resin layer 22.

The same effect is obtained with the above-described ninth embodiment as with the first embodiment.

In addition, in the ninth embodiment, a recess is not provided in the sealing resin layer 22 on the other main surface 2b side of the substrate 2, but the configuration is not limited to this example, and for example, in the case where a component that generates electromagnetic waves and a component that is affected by electromagnetic waves are mounted on the other main surface 2b, a recess may be provided between the components in the sealing resin layer 22 in a plan view in a direction perpendicular to the one main surface 2a.

Tenth Embodiment

A module 1K according to a tenth embodiment of the present disclosure will be described while referring to FIGS.

Figure 12A:
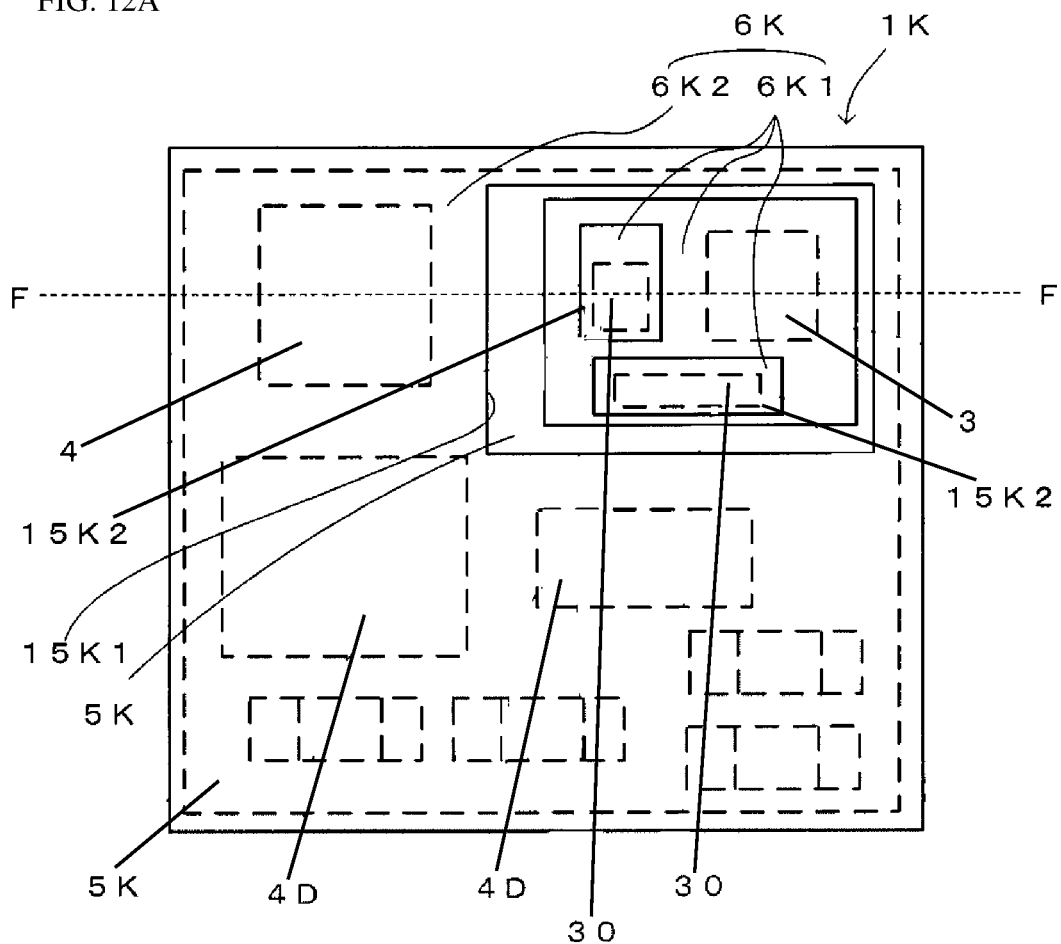
FIG. 12A is a plan view of a module according to a tenth embodiment of the present disclosure and FIG. 12B is a sectional view taken along line F-F in FIG. 12A.

12A and 12B. FIG. 12A is a plan view of the module 1K according to the tenth embodiment and FIG. 12B is a sectional view taken along line F-F in FIG. 12A.

Figure 12B:
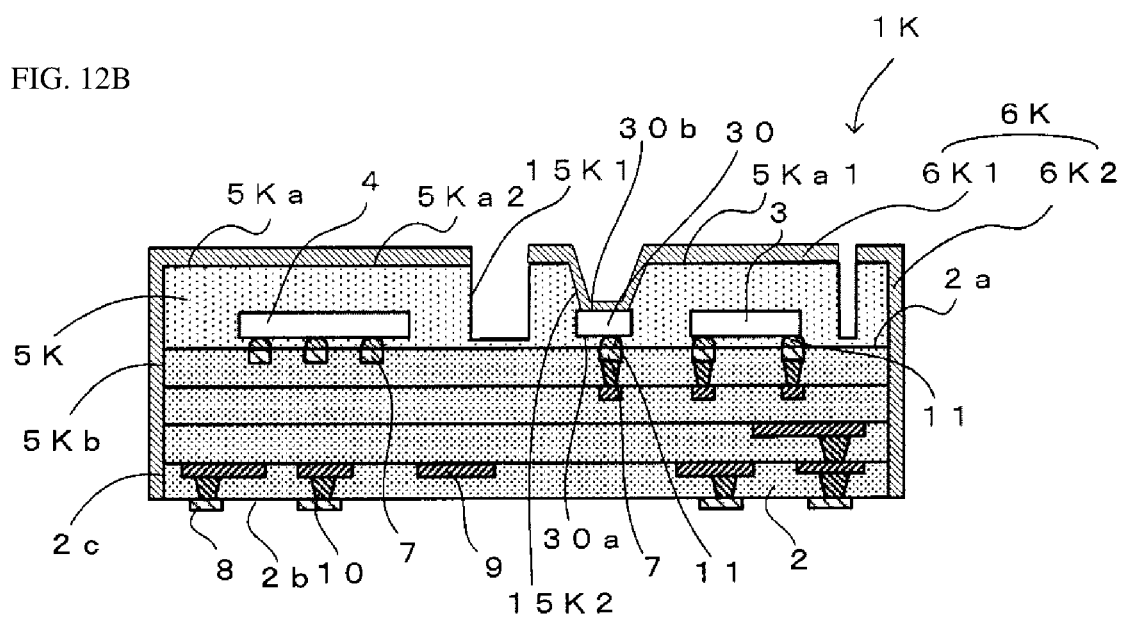
Figure 13:
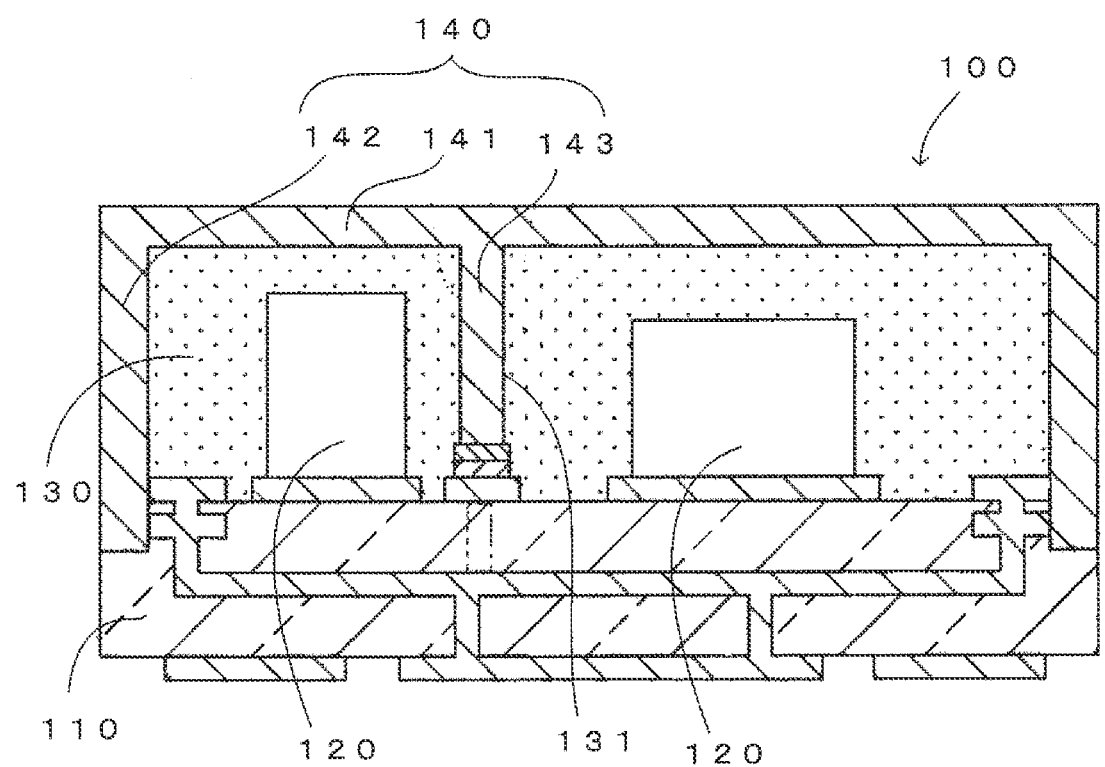
FIG. 13 is a sectional view of a module of the related art.

As illustrated in FIGS. 12A and 12B, the module 1K according to the tenth embodiment of the present disclosure differs from the module 1D according to the fourth embodiment described using FIG. 5 in that shield components 30, which electrically connect a first shield portion 6K1 that is above the first component 3 to a ground electrode provided in the substrate 2, are provided between the first component 3 and the second components 4 and 4D and on the inner side of a recess 15K1. Parts of the configuration that are the same as in the module 1D according to the fourth embodiment are denoted by the same reference symbols and description thereof is omitted.

The shield components 30 are mounted between the first component 3 and second components 4 and 4D on the one main surface 2a of the substrate 2 in addition to the first component 3 and the second components 4 and 4D. The shield components 30 will be described below.

The recess 15K1 is formed in a sealing resin layer 5K toward the one main surface 2a from a surface 5ka (hereinafter referred to as an "upper surface") of the sealing resin layer 5K that is farthest from one main surface 2a and on the opposite side from the surface of the sealing resin layer 5K that faces the one main surface 2a so as to be outside the first component 3, pass between the first component 3 and the second components 4 and 4D, and surround the entire periphery of the first component 3 in a plan view from a direction perpendicular to the one main surface 2a. The upper surface 5Ka of the sealing resin layer 5K is divided by the recess 15K1 into a first region 5Ka1, which is on a side that overlaps the first component 3, and a second region 5Ka2, which on a side that overlaps the second components 4 and 4D, in a plan view from a direction perpendicular to the one main surface 2a. The depth of the recess 15K1 from the surface including the upper surface 5Ka of the sealing resin layer 5K is a depth with which the recess 15K1 does not reach the one main surface 2a. The depth of the recess 15K1 is not particularly limited, and may be for example a depth with which the recess 15K1 reaches the one main surface 2a or may be a depth with which the recess 15K1 reaches a prescribed position between a surface including a circuit mounting surface of the first component 3 or a circuit mounting surface of the second components 4 and 4D and the one main surface 2a.

Through holes 15K2 are formed in the sealing resin layer 5K from a surface of the sealing resin layer 5K including the first region 5Ka1 toward surfaces (hereafter referred to as "upper surfaces") 30b of the shield components 30 that are on the opposite side from surfaces (hereafter, referred to as "lower surfaces") 30a of the shield components 30 that face the one main surface 2a up to a position that reaches the upper surfaces 30b in at least part of a region of the sealing resin layer 5K that overlaps the shield components 30 in a plan view from a direction perpendicular to the one main surface 2a. The area of each through hole 15K2 decreases from the first region 5Ka1 of the sealing resin layer 5K toward the upper surface 30b of the shield component 30 in a plan view from a direction perpendicular to the one main surface 2a.

The module 1K is provided with a shield layer 6K including the first shield portion 6K1 and a second shield portion 6K2. The first shield portion 6K1 is for covering the first region 5Ka1 and the through holes 15K2 of the sealing resin layer 5K and the part of the upper surfaces 30b of the shield components 30 exposed from the sealing resin layer 5K. In addition, the second shield portion 6K2 is for covering the second region 5Ka2 and a side surface 5Kb of the sealing resin layer 5K and the side surface 2c of the substrate 2. However, the shield layer 6K is not provided in the recess 15K1 of the sealing resin layer 5K. The first shield portion 6K1 corresponds to a "shield part" of the present disclosure.

The shield components 30 are metal blocks. The shield components 30 are each arranged inside from a side wall surface, which is on the first component 3 side, among side wall surfaces of the recess 15K1. The lower surfaces 30a of the shield components 30 are connected to land the electrodes 7 using solder 11 and the upper surfaces 30b of the shield components 30 are connected to the first shield portion 6K1 of the shield layer 6K. The land electrodes 7 that are connected to the lower surfaces 30a of the shield components 30 are connected to the ground electrode provided in the substrate 2. Thus, the first shield portion 6K1 is electrically connected to the ground electrode via the shield components 30. The entirety of each shield component 30 corresponds to a "conducting portion" of the present disclosure.

The same effect is obtained with the above-described tenth embodiment as with the fourth embodiment. Furthermore, the first shield portion 6K1, which is inside from the recess 15K1, is electrically connected to the ground electrode via the shield components 30. Thus, the first shield portion 6K1 functions as a shield film, and therefore unwanted electromagnetic waves electromagnetic waves generated by the first component 3 are unlikely to leak to the outside. In addition, since the parts that cover the through holes 15K2 out of the first shield portion 6K1 and the second shield portion 6K2 function as shield walls, the second components 4 and 4D are less likely to be affected by the unwanted electromagnetic waves generated by the first component 3 and can operate more stably.

In addition, in the tenth embodiment, the shield components 30 are metal blocks, but the shield components 30 are not limited to this configuration and for example, may instead have the following configuration. It is sufficient that the shield components 30, each has a conducting portion that extends from the upper surface 30b to the lower surface 30a thereof. For example, the conducting portion may be formed on a side surface of the shield component 30, or may be formed on a wall surface of a through hole from the upper surface 30b to the lower surface 30a or so as to fill the through hole. In this case as well, the first shield portion 6K1 is electrically connected to the ground electrode via the conducting portions of the shield components 30.

The present disclosure is not limited to the above-described embodiments and can be modified in various ways not described above so long as they do not depart from the gist of the disclosure. For example, the content of the embodiments and the content of the modifications described above may be combined with each other.

INDUSTRIAL APPLICABILITY

The present disclosure can be applied to a module having a structure that suppresses interference between components mounted on a substrate caused by unwanted electromagnetic waves.

REFERENCE SIGNS LIST 1, 1A to 1K module
2 substrate 3 first component
4, 4C, 4D second component
5, 5A to 5D, 5H, 22 sealing resin layer
6, 6E to 6J, 6K shield layer
6K1 first shield portion
6K2 second shield portion
7B land electrode
15, 15A to 15D, 15H, 15K1 recess
15K2 through hole
30 shield component

The invention claimed is:

1. A module comprising:
a substrate;
a first component and a second component that are mounted on one main surface of the substrate;
a sealing resin layer that seals the first component and the second component; and
a shield layer that covers part of the sealing resin layer;
wherein a recess is provided in the sealing resin layer toward the one main surface from a surface of the sealing resin layer that is on an opposite side from a surface of the sealing resin layer that faces the one main surface between at least the first component and the second component in a plan view from a direction perpendicular to the one main surface, and
an entire surface of inside the recess of the sealing resin layer is exposed to an outside of the module.

2. The module according to claim 1,
wherein an electrode is provided on the one main surface, and
the recess reaches the one main surface in a region of the sealing resin layer that overlaps the electrode in a plan view from a direction perpendicular to the one main surface.

3. The module according to claim 1,
wherein the recess is provided outside the first component so as to pass between the first component and the second component and surround an entire periphery of the first component in a plan view from a direction perpendicular to the one main surface.

4. The module according to claim 3, further comprising:
a shield component that is mounted on the one main surface of the substrate between the first component and the second component inside from a side wall surface of the recess that is on a first component side among side wall surfaces of the recess in a plan view from a direction perpendicular to the one main surface;
wherein the shield component has a conducting portion that extends from a facing surface of the shield component that faces the one main surface to an opposite surface of the shield component that is on an opposite side from the facing surface and the conducting portion is connected to a ground electrode provided in the substrate on a side close to the facing surface of the shield component,
a through hole that reaches the shield component is provided in the sealing resin layer from a surface of the sealing resin layer that is on an opposite side from a surface of the sealing resin layer that faces the one main surface to the opposite surface of the shield component in at least part of a region that overlaps the shield component in a plan view from a direction perpendicular to the one main surface, and
the shield layer is connected to the shield component in the through hole.

5. The module according to claim 1,
wherein the recess is provided so as to pass between the first component and the second component from one side surface to another side surface of the sealing resin layer in a plan view from a direction perpendicular to the one main surface.

6. The module according to claim 3,
wherein the shield layer is not provided on one out of a first region and a second region that are provided and divided from each other by the recess, the first region overlapping the first component and the second region overlapping the second component in a plan view from a direction perpendicular to the one main surface.

7. The module according to claim 5,
wherein the shield layer is not provided on one out of a first side surface portion and a second side surface portion, the first side surface portion surrounding the first component together with the recess and the second side surface portion surrounding the second component together with the recess in a plan view from a direction perpendicular to the one main surface.

8. The module according to claim 1,
wherein the recess is provided so as to pass between the first component and the second component from one side surface of the sealing resin layer toward another side surface of the sealing resin layer up to a position where the recess does not reach the other side surface in a plan view from a direction perpendicular to the one main surface, and
the shield layer is not provided on the one side surface of the sealing resin layer.

9. The module according to claim 1, further comprising:
a third component that is mounted on another main surface of the substrate; and
another sealing resin layer that seals the third component.

10. The module according to claim 2,
wherein the recess is provided outside the first component so as to pass between the first component and the second component and surround an entire periphery of the first component in a plan view from a direction perpendicular to the one main surface.

11. The module according to claim 2,
wherein the recess is provided so as to pass between the first component and the second component from one side surface to another side surface of the sealing resin layer in a plan view from a direction perpendicular to the one main surface.

12. The module according to claim 4,
wherein the shield layer is not provided on one out of a first region and a second region that are provided and divided from each other by the recess, the first region overlapping the first component and the second region overlapping the second component in a plan view from a direction perpendicular to the one main surface.

13. The module according to claim 5,
wherein the shield layer is not provided on one out of a first region and a second region that are provided and divided from each other by the recess, the first region overlapping the first component and the second region overlapping the second component in a plan view from a direction perpendicular to the one main surface.

14. The module according to claim 6,
wherein the shield layer is not provided on one out of a first side surface portion and a second side surface portion, the first side surface portion surrounding the first component together with the recess and the second side surface portion surrounding the second component together with the recess in a plan view from a direction perpendicular to the one main surface.

15. The module according to claim 2,
wherein the recess is provided so as to pass between the first component and the second component from one side surface of the sealing resin layer toward another side surface of the sealing resin layer up to a position where the recess does not reach the other side surface in a plan view from a direction perpendicular to the one main surface, and
the shield layer is not provided on the one side surface of the sealing resin layer.

16. The module according to claim 2, further comprising:
a third component that is mounted on another main surface of the substrate; and
another sealing resin layer that seals the third component.

17. The module according to claim 3, further comprising:
a third component that is mounted on another main surface of the substrate; and
another sealing resin layer that seals the third component.

18. The module according to claim 4, further comprising:
a third component that is mounted on another main surface of the substrate; and
another sealing resin layer that seals the third component.

19. The module according to claim 5, further comprising:
a third component that is mounted on another main surface of the substrate; and
another sealing resin layer that seals the third component.

20. The module according to claim 6, further comprising:
a third component that is mounted on another main surface of the substrate; and
another sealing resin layer that seals the third component.

\* \* \* \* \*